(12) United States Patent
Baumgarte

(10) Patent No.: US 9,607,624 B2
(45) Date of Patent: Mar. 28, 2017

(54) METADATA DRIVEN DYNAMIC RANGE CONTROL

(71) Applicant: Apple Inc., Cupertino, CA (US)

(72) Inventor: Frank M. Baumgarte, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 29 days.

(21) Appl. No.: 14/226,596

(22) Filed: Mar. 26, 2014

(65) Prior Publication Data

US 2014/0297291 A1    Oct. 2, 2014

Related U.S. Application Data

(60) Provisional application No. 61/806,628, filed on Mar. 29, 2013, provisional application No. 61/857,966, (Continued)

(51) Int. Cl.
  *G10L 19/00* (2013.01)
  *G10L 21/00* (2013.01)
  (Continued)

(52) U.S. Cl.
  CPC ............ *G10L 19/02* (2013.01); *G10L 19/008* (2013.01); *G10L 19/032* (2013.01);
  (Continued)

(58) Field of Classification Search
  USPC ........................................................ 704/500
  See application file for complete search history.

(56) References Cited

U.S. PATENT DOCUMENTS 6,782,366 B1    8/2004  Huang et al.
2007/0016418 A1*  1/2007  Mehrotra ............ G10L 19/0017
                                                    704/240

(Continued)

FOREIGN PATENT DOCUMENTS

WO    WO-2011100155         8/2011
WO    WO-2013/068637 A1     5/2013

OTHER PUBLICATIONS

PCT International Search Report and The Written Opinion of the International Searching Authority for PCT/US2014/032079, mailed Jul. 23, 2014.

(Continued)

*Primary Examiner* — Marivelisse Santiago Cordero
*Assistant Examiner* — Kevin Ky
(74) *Attorney, Agent, or Firm* — Blakely, Sokoloff, Taylor & Zafman LLP

(57) ABSTRACT

A system for encoding and applying Dynamic Range Control/Compression (DRC) gain values to a piece of sound program content is described. In particular, a set of DRC gain values representing a DRC gain curve for the piece of content may be divided into frames corresponding to frames of the piece of content. A set of fields may be included with an audio signal representing the piece of content. The additional fields may represent the DRC gain values using linear or spline interpolation. The additional fields may include 1) an initial gain value for each DRC frame, 2) a set of slope values at particular points in the DRC curve, 3) a set of time delta values for each consecutive pair of slope values, and/or 4) one or more gain delta values representing changes of DRC gain values in the DRC gain curve between points of the slope values.

26 Claims, 11 Drawing Sheets

Related U.S. Application Data filed on Jul. 24, 2013, provisional application No. 61/891,687, filed on Oct. 16, 2013.

(51) Int. Cl.

| | |
|---|---|
| *G10L 19/02* | (2013.01) |
| *G10L 19/008* | (2013.01) |
| *G10L 19/032* | (2013.01) |
| *G10L 19/16* | (2013.01) |
| *H03G 7/00* | (2006.01) |

(52) U.S. Cl.
CPC .......... *G10L 19/167* (2013.01); *H03G 7/002* (2013.01); *H03G 7/007* (2013.01)

(56) References Cited

U.S. PATENT DOCUMENTS

| | | | |
|---|---|---|---|
| 2010/0040135 | A1* | 2/2010 | Yoon ............... G10L 19/018 375/240.01 |
| 2010/0083344 | A1 | 4/2010 | Schildbach |
| 2010/0250258 | A1 | 9/2010 | Smithers et al. |
| 2010/0310085 | A1 | 12/2010 | Oh et al. |
| 2012/0310654 | A1 | 12/2012 | Riedmiller et al. |
| 2013/0156229 | A1 | 6/2013 | Riedl |

OTHER PUBLICATIONS

Charles Q. Robinson and Kenneth Gundry, "Dynamic Range Control via Metadata", presented at the 107th Convention, AES, Sep. 24-27, 1999, New York, 14 pages.
ATSC Recommended Practice: Techniques for Establishing and Maintaining Audio Loudness for Digital Television, Document A/85:2011, XP055102421, Jul. 25, 2011, 76 pages.
Ralph Sperschneider, ISO/IEC 13818-7:2003 (MPEG-2 AAC, Second Edition), International Organisation for Standardisation, Organisation Internationale De Normalisation, ISO/IEC JTC1/SC29/WG11, Coding of Moving Pictures and Audio, N5374, Dec. 2002, 190 pages.
Frank Baumgarte, "Enhanced Metadata for Dynamic Range Compression", International Organization For Standardization, Organisation Internatinale De Normalisation, ISO/IEC JTC1/SC29/WG11 MPEG2013/M28901, Coding of Moving Pictures and Audio, Apr. 2013, 10 pages.
International Preliminary Report on Patentability and Written Opinion, dated Oct. 8, 2015, Application No. PCT/US2014/032079.
Fraunhofer IIS. "White Paper HE-AAC Metadata for Digital Broadcasting." (Sep. 2011). 16 pages.
ATSC, "A/53:ATSC Digital Television Standard, Parts 1-6, 2007" Advanced Television Systems Committee, Inc. Washington, D.C. (Jan. 3, 2007). 136 pages.
ATSC, "ATSC Recommended Practice: Techniques for Establishing and Maintaining Audio Loudness for Digital Television", Document A/85:2011, pp. 1-76. Advanced Television Systems Committee, Inc. Washington, D.C. (Jul. 25, 2011). 76 pages.
ATSC, "ATSC Standard: Digital Audio Compression (AC-3, E-AC-3)", *Advanced Television Systems Committee.* Doc. A/52: 2012. Washington, D.C. (Dec. 17, 2012). 270 pages.
Dolby Laboratories, Inc., "Dolby Metadata Guide", Issue 3. S05/14660/16797 (2005). 28 pages.
EBU-UER, "EBU Recommendation R 128 "Loudness Normalisation and Permitted Maximum Level of Audio Signals"". Geneva, Switzerland (Aug. 2011). 5 pages.
ETSI, "Digital Video Broadcasting (DVB); Specification for the Use of Video and Audio Coding in Broadcasting Applications Based on the MPEG-2 Transport Stream.", ETSI TS 101 154 v1.11.1. European Telecommunication Standards Institute; European Broadcasting Union (Nov. 2012). 195 pages.
Giannoulis, D., "A Design of a Digital, Parameter-automated Dynamic Range Compressor." MSC Project Report. Queen Mary University of London (Aug. 26, 2010). 92 pages.
Massberg, M. "Investigation in Dynamic Range Compression." MSC Project Report. Queen Mary University of London (Aug. 25, 2009). 66 pages.
ISO/IEC, "Coding of Moving Pictures and Audio." *ISO/IEC 13818-7, International Standard* (2003). 206 pages.
ISO/IEC, "Information Technology—Coding of Audio-Visual Objects—Part 3: Audio." *ISO/IEC 14496-3*, Subpart 4 International Standard (2009). 150 pages.
ISO/IEC, "ISO/IEC 14496-3:200X(E)." Fourth Edition, Switzerland (2009). 150 pages.
ISO/MPEG, "On ISO/IEC 14496-12 Technologies under Consideration: Enhanced Audio Support." Contribution M29150, 104th MPEG meeting, Incheon, Korea (Apr. 2013). 14 pages.
ISO/MPEG, "Enhanced Metadata for Dynamic Range Compression." ISO/IEC JTC1/SC29/WG11 MPEG2013/M28901. Incheon, Korea (Apr. 2013). 10 pages.
ISO/MPEG, "Information Technology—MPEG Audio Technologies—Part 1: MPEG Surround." *ISO/IEC FDIS 23003-1* (2006). 294 pages.
ISO/MPEG, "Information Technology—MPEG Audio Technologies—Part 2: Spatial Audio Object Coding." *ISO/IEC FDIS 23003-2* (2010). 139 pages.
ISO/MPEG, "Timeline and Requirements for MPEG-H 3D Audio Version 1." ISO/IEC JTC1/SC29/WG11/N13855. Vienna, Austria (Aug. 2013).
ISO/MPEG, "Proposed Revision of Audio Aspects of WD: Addition of Sample Aspect Ratio and Further Audio Code-Points." Vienna, Austria (Jul. 2013). 7 pages.
ISO/MPEG, "Information Technology—MPEG Audio Technologies—Part 3: Unified Speech and Audio Coding." *ISO/IEC FDIS 23003-3:2011* (2011). 286 pages.
International Telecommunications Union, ITU-R Radiocommunication Sector of ITU, "Algorithms to Measure Audio Programme Loudness and True-Peak Audio Level." Recommendation ITU-R BS.1770-3., Geneva, Switzerland (Aug. 2012). 24 pages.
Wang, et al., "Modified Discrete Cosine Transform—Its Implications for Audio Coding and Error Concealment." *JAES*, vol. 51, No. 1/2 (Jan./Feb. 2003). 10 pages.
ISO/IEC. "Working Draft for Aspect Ratio Amendment to CICP." ISO/IEC/JTC1/SC298/WG11/N13595. Incheon, Korea (Apr. 2013). 6 pages.
ISO/MPEG. "Improved Audio Support in the ISO Base Media File Format." ISO/IEC JTC1/SC29/WG11, MPEG2013/m31470. Geneva, Switzerland (Oct. 23, 2013). 12 pages.
Australian Patent Examination Report (dated Jun. 3, 2016), Application No. 2014241174, date filed: Mar. 27, 2014, 4 pages.
European Patent Office First Communication pursuant to Art. 94(3) EPC (dated Jun. 10, 2016), International Application No. PCT/US2014/032079, EP Application No. 14723227.6, Date filed: Mar. 27, 2014, 5 pages.
Taiwanese Office Action (Oct. 23, 2015), Application No. 103111834, date filed: Mar. 28, 2014, 6 pages.
Korean Office Action with English Language Translation, dated Aug. 11, 2016, Korean Application No. 10-2015-7026766.
Sperschneider, Ralph, "Coding of Moving Pictures and Audio", *ISO/IEC13818-7:2004 (MPEG-2 AAC 3rd Edition)*, ISO/IEC JTC1/SC29/WG11, N6428, Munich, Germany, (Mar. 2004).

* cited by examiner

METADATA DRIVEN DYNAMIC RANGE CONTROL

RELATED MATTERS

This application claims the benefit of the earlier filing dates of U.S. provisional application No. 61/806,628, filed Mar. 29, 2013; U.S. provisional application No. 61/857,966 filed Jul. 24, 2013; and U.S. provisional application No. 61/891,687 filed Oct. 16, 2013.

FIELD

An embodiment of the invention generally relates to a system and method for encoding and applying Dynamic Range Control/Compression (DRC) to an audio signal. Furthermore, the system and method described herein takes into account the DRC requirements of new codecs under development in MPEG-H (3D Audio). Other embodiments are also described.

BACKGROUND

Dynamic Range Control/Compression (DRC) reduces the dynamic range of an audio signal by some amount by (1) making soft parts in the audio signal louder; (2) making loud parts in the audio signal softer; or (3) both making soft parts louder and making loud parts softer. A reduced dynamic range may be desirable in several situations, including for audio playback systems that can only reproduce a small dynamic range while maintaining low distortions, listening environments with distracting sounds, and in situations where the listener does not want to distract others.

Although, DRC is an important feature for today's audio codecs, several recent audio codecs do not support DRC. For example, DRC is absent in the Unified Speech and Audio Coding (USAC) standard by the Moving Picture Experts Group (MPEG). Advanced Audio Coding (AAC) incorporates a DRC tool, but this DRC tool has drawbacks, including limited time resolution and aliasing distortions.

SUMMARY

A system and method for encoding and applying Dynamic Range Control/Compression (DRC) gain values to a piece of sound program content is described. In one embodiment, a set of DRC gain values representing a DRC gain curve for the piece of sound program content may be divided into frames corresponding to frames of the piece of sound program content. An additional field or set of fields may be included with an audio signal representing the piece of sound program content. The additional fields may represent the DRC gain values using linear or spline interpolation. In one embodiment, the additional fields may include 1) an initial gain value for each DRC frame, 2) a set of slope values at particular points in the DRC curve, 3) a set of time delta values for each consecutive pair of slope values, and 4) one or more gain delta values representing changes of DRC gain values in the DRC gain curve between points corresponding to the slope values. As described, the system and method herein provides an efficient technique for encoding and applying DRC gain values for a piece of sound program content.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Figure 1:
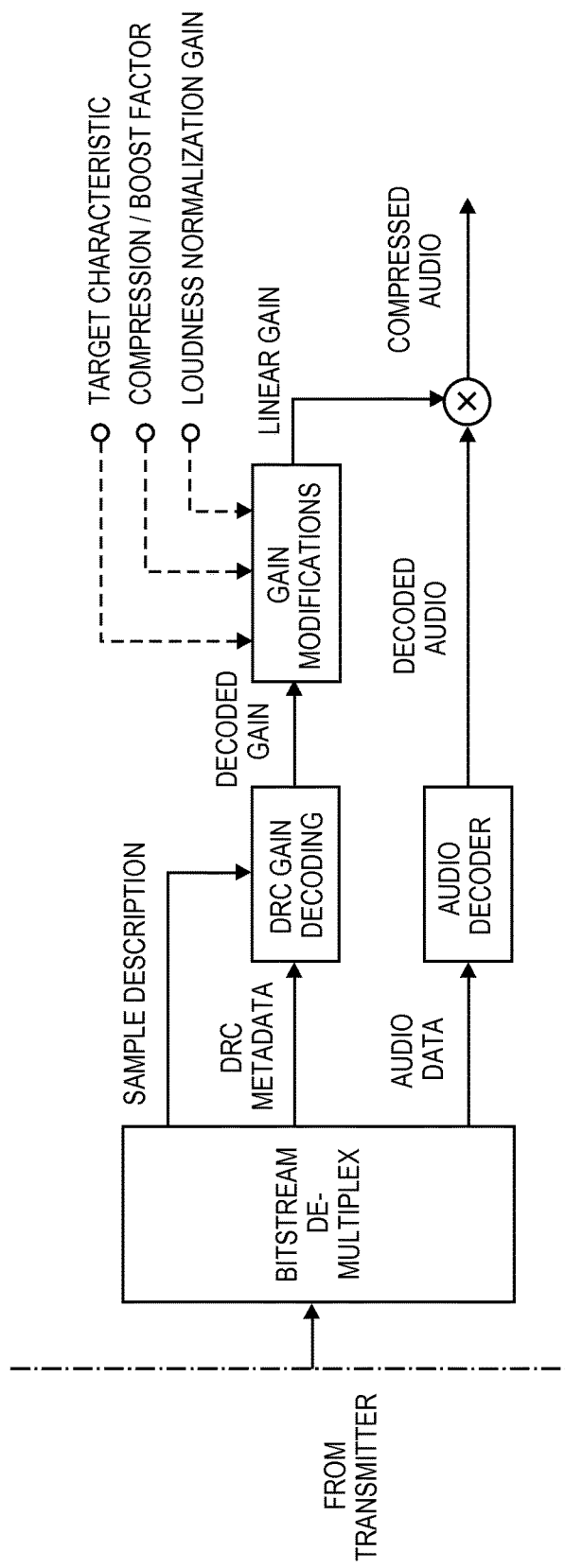
FIG. 1 shows a block diagram of compression post processing following an audio decoder according to one embodiment.

Several embodiments of the invention with reference to the appended drawings are now explained. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Metadata systems which incorporate Dynamic Range Control/Compression (DRC) metadata into the bitstream/format provide several advantages over systems that determine DRC gain values at the listener's end (i.e., at playback). These advantages include (1) lower complexity at playback of the audio signal; (2) complexity of DRC is less of an issue during playback, which allows more complex DRC procedures to be implemented; and (3) an audio playback device at the listener's end may decide whether to apply DRC. Although using DRC metadata systems offer several advantages, traditional DRC metadata systems, such as those provided by the Advanced Television Systems Committee (ATSC) and the Moving Picture Experts Group's (MPEG) also provide several disadvantages.

Traditional DRC metadata systems (e.g., those defined by ATSC and MPEG standards) support light and heavy compression as shown in Table 1. In most cases, the rate of DRC gain value updates is one per frame. At a sample rate of 48 kHz, this is equivalent to an update interval between 21 and 43 ms. AC-3 in light compression mode has a six-times faster rate, at approximately 5 ms at 48 kHz. Moreover, the DRC gain values in these traditional DRC metadata systems are updated at lower rates for lower audio sample rates.

TABLE 1

Parameters of DRC gain metadata in audio standards

| Standard | ATSC: AC-3 | MPEG: (HE) AAC |
|---|---|---|
| Light Compression | "Line Mode" | MPEG "Dynamic Range Control" |
| Range | −24 . . . +24 dB | −31.75 . . . +31.75 dB |
| Granularity | 0.25 dB | 0.25 dB |
| Rate | 1 value per 256 samples | 1 value per frame (1024 or 2048 samples) |
| Heavy compression | "RF Mode" | DVB "compression value" |
| Range | −48 . . . +48 dB | −48 . . . +48 dB |
| Granularity | 0.5 dB | 0.5 dB |
| Rate | 1 value per 1536 samples | 1 value per frame |

Actual DRC tuning suggests that gain changes should be much faster for certain audio signals than what can be achieved with current standards.

Another problem with current DRC standards and systems, such as MPEG-AAC and ATSC, arises from the fact that the DRC gain is applied in the frequency domain before an inverse MDCT filter bank is applied. The MDCT filter bank is a transform based on time-domain aliasing cancelation. Aliasing cancelation cannot be achieved if different gain values are applied to consecutive overlapping blocks. A gain change can result in audible distortions such as pre-echoes. This can easily be shown for a castanet recording.

In one embodiment, MDCT artifacts may be avoided if the DRC gain is applied in the time domain after the audio signal is reconstructed by the decoder. In the frequency domain the gain may be modified at most once per long or short block. In contrast, the time-domain approach described herein supports the desired higher time resolution.

Time domain approaches currently do not support multi-band DRC (available by MPEG light compression), but embodiments discussed herein may be enhanced to support multi-band DRC. The proposed scheme may slightly increase decoder complexity due to interpolation and application of DRC gains. However, these drawbacks appear irrelevant given that unnecessary distortions can be avoided especially with content that may come at a high bit rate and may be reproduced with a high quality playback system.

DRC Tool

Overview

The DRC tool described herein is based on a unified DRC gain encoding that may be applied to a time domain or sub-band domain audio signal such as the sub-bands of the QMF filter bank of an HE-AAC decoder. The following description covers the time-domain application first. For the sub-band domain application only modifications to the time-domain approach are described.

Time-Domain Application

This section describes how the dynamic compression tool is applied to a time-domain audio signal after decoding as shown in FIG. 1. FIG. 1 shows a block diagram of compression post processing following an audio decoder. In one embodiment, the decoder part of the DRC tool is driven by metadata that efficiently represents the compression gain samples and parameters for interpolation. In some embodiments, the gain samples may be updated as fast as necessary to accurately represent gain changes down to at least 1 ms update intervals. If the gain is virtually constant, it may be sufficient to only use a single gain sample per DRC frame. To minimize the bit rate, the encoder may choose just enough DRC gain samples to ensure sufficient accuracy of the reconstructed DRC gain in an audio signal after decoding. In practice, this may mean smaller update intervals when there are larger gain changes.

Since the encoder provides only sparsely sampled gain values, the decoder may apply interpolation to achieve a smooth gain transition between the samples. The sample rate of the interpolated gain is the audio sample rate. The interpolation technique used may be based on splines. The interpolated values of one segment between two subsequent gain samples are derived from the two gain samples at both ends of the segment and their slope (derivative). Hence, when transitioning from one segment to the next, the first derivative is continuous as both segments have the same slope at the transition point.

Figure 2:
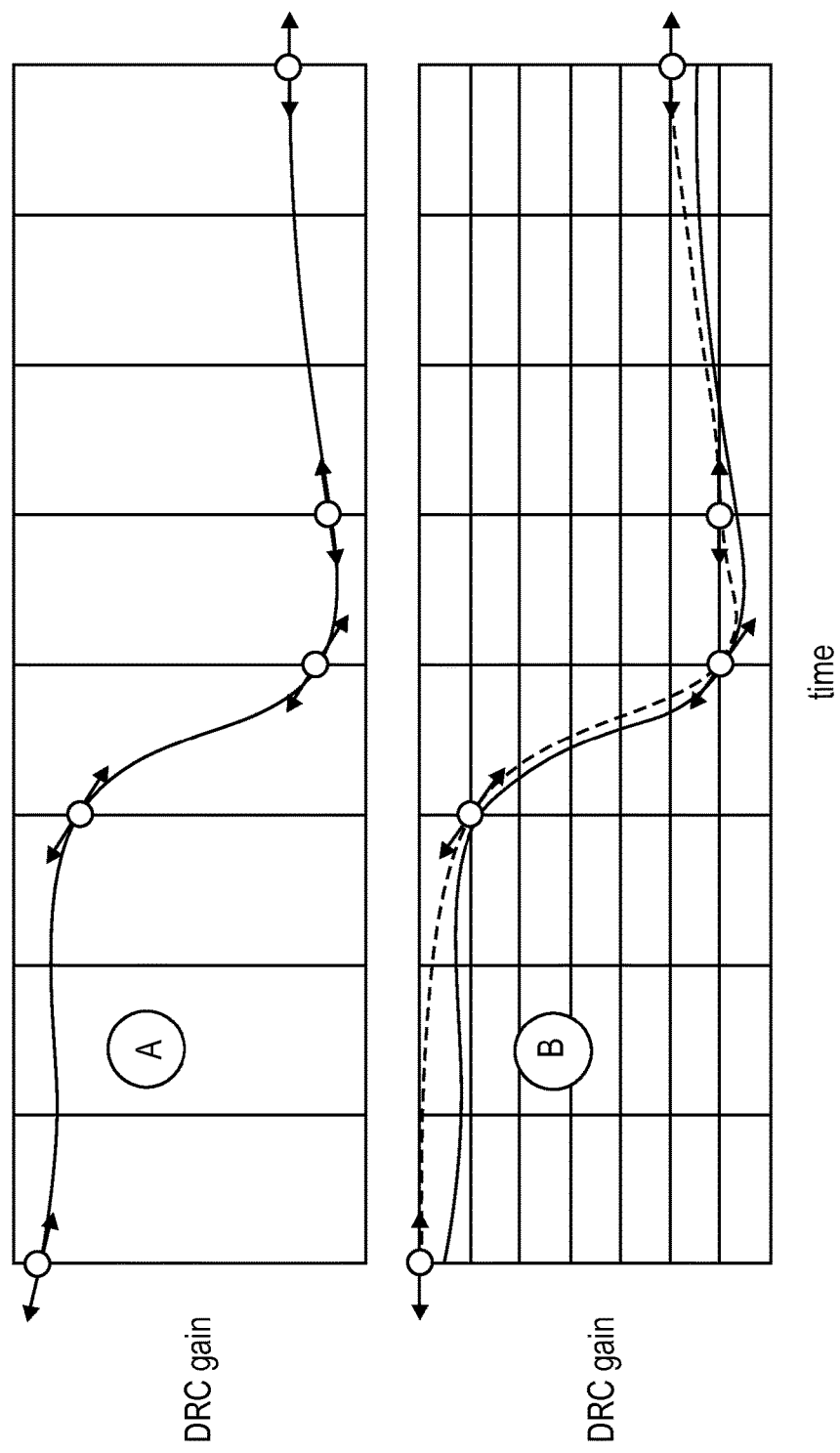
FIG. 2 shows Dynamic Range Control/Compression (DRC) gain representation according to one embodiment.

FIG. 2 illustrates the interpolation based on quantized DRC gain samples. The upper curve A shows the DRC output gain at a high sampling rate such as the audio sample rate. Samples of the DRC gain and the slope (i.e., circles and arrows) are taken sparsely based on a uniform time grid. The lower graph B shows the quantized gain sample coordinates (time and value) and the quantized slope that are transmitted to the DRC decoder tool. The decoder tool interpolates the gain curve before it is applied to the audio signal as illustrated by the dashed line.

In one embodiment, the smallest possible time interval for sampling the gain curve is a fixed value between 0.5 and 1.0 ms and the largest possible time interval is one gain sample per DRC frame.

In addition to the spline mode described above, a "simple" mode may be used to transmit just one DRC gain value per DRC frame without timing and slope parameters. This mode is most suitable for frames with virtually constant DRC gain and consumes the lowest number of bits.

For applications of the DRC tool in tandem with an audio codec, the following parameters are provided to adjust the DRC frame size and time resolution so that codec and DRC processing can be done most efficiently in terms of complexity and delay. The parameters are:

DRC frame size in units of the audio sample interval delta_t_min in units of the audio sample interval delay mode These parameters have default values, but a codec specification may overwrite the defaults.

Modifying the DRC Characteristic

The DRC tool supports modifications of the decoded DRC gain by several means:

Boost factor

Compress factor

Custom DRC characteristic

The boost factor is a value between 0 and 1 that is applied to positive gain values in dB to reduce amplification. The compress factor is a value between 0 and 1 applied to negative gain values to reduce attenuation.

Figure 3:
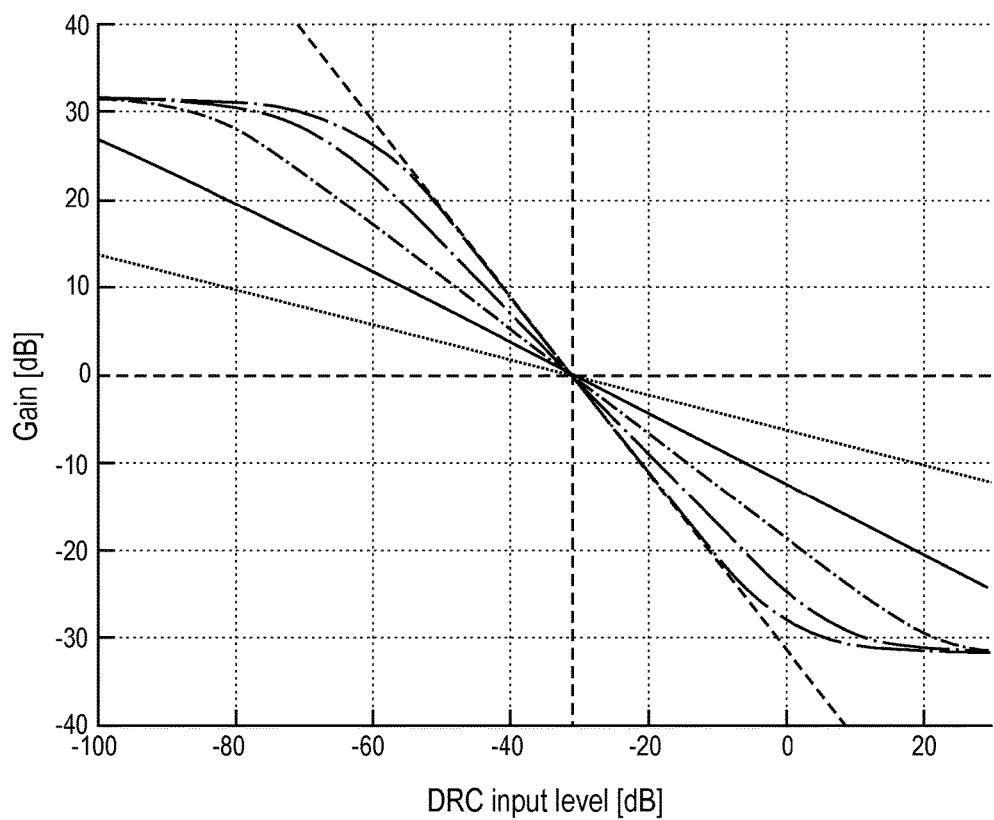
FIG. 3 shows encoder DRC characteristics according to one embodiment.

The DRC configuration that includes the encoder DRC may be referred to hereinafter as the "Sample Description". For example, the first six static DRC characteristics are shown in FIG. 3. Conceptually, such a static compressor characteristic can be measured using a 1 kHz sinusoid, if the characteristic is not explicitly available from the DRC algorithm. The level of the sinusoid is defined to be −3 dBFS when the peak is at full scale. The characteristics shown in FIG. 3 have various degrees of compression down to no compression at all. In the simplest case, a characteristic is chosen according to the desired compression effect. When overloads must be controlled as well, for instance for a downmix, optionally only a limiter can be applied in the encoder which may not have a static compression effect. Hence, the characteristic with a constant zero dB gain can be useful, if only a limiter is applied but no DRC. In general, the DRC gain conveyed in the bitstream can be the result of either dynamic compression or limiting or both.

Figure 4:
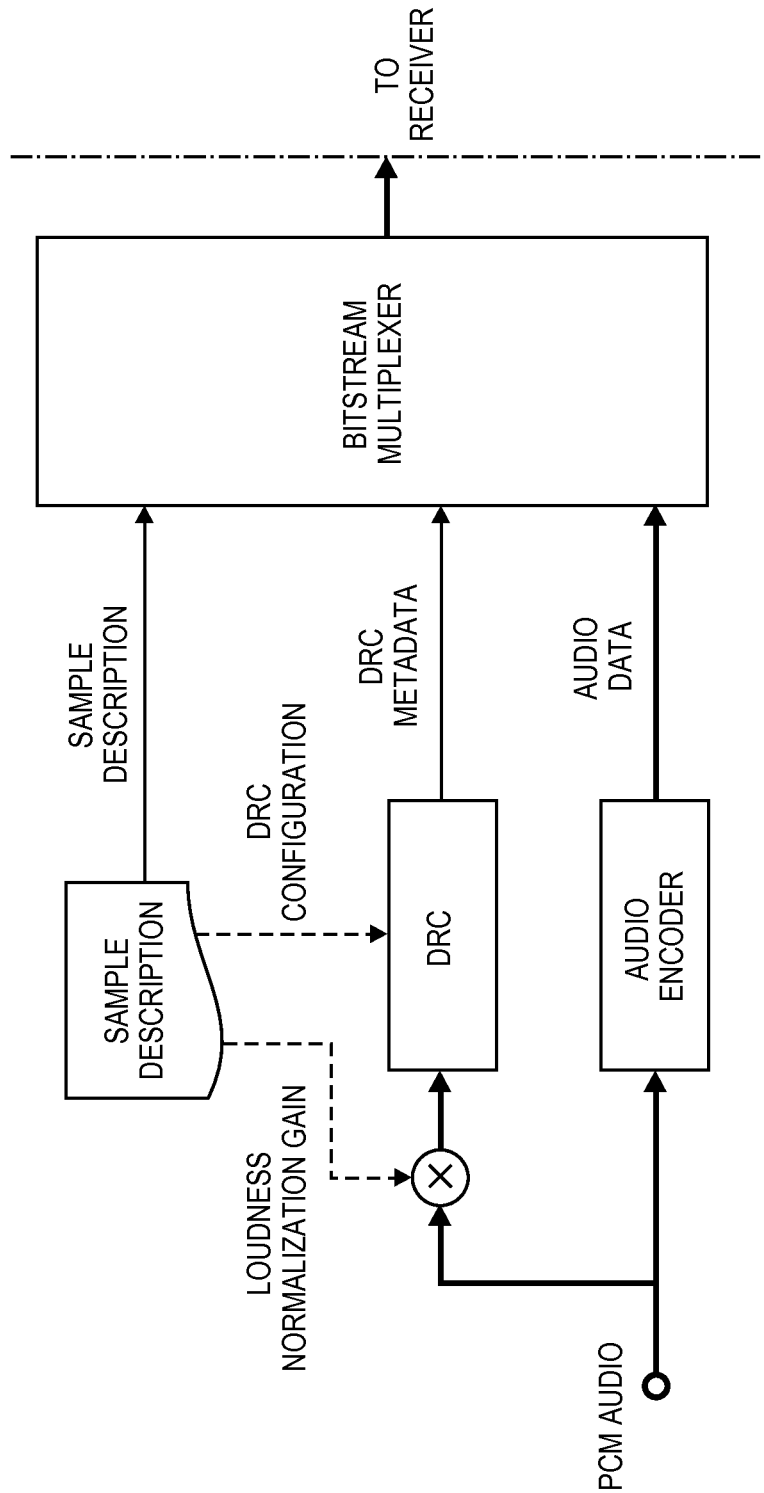
FIG. 4 shows an example set of DRC metadata generated at the transmitter according to one embodiment.

An example for the DRC metadata generation at the transmitter is shown in FIG. 4. The DRC is configured based on the Sample Description according to the draft ISO/IEC 14496-12. The audio signal may be loudness normalized to −31 LKFS before it enters the DRC. The DRC metadata may be transmitted along with the audio bitstream.

The receiver can modify the static DRC characteristic based on the transmitter's DRC characteristic as conveyed in the Sample Description and based on a custom target DRC characteristic. Starting with the received DRC gain value (gainQuant), the receiver can apply the inverse transmitter DRC characteristic and then apply a new target DRC characteristic as shown in Table 2:

TABLE 2

DRC gain mapping according to a target DRC characteristic

```
mapGain(gainQuant) {
    inLevel = inverseCompressorIO(gainQuant);
    outgain = targetCompressorIO(inLevel);
    return outgain;
}
```

The inverse of the transmitter characteristics 1 to 6 may be computed according to Table 3 and Table 4. Please note that characteristic 2 does not have a useful inverse because the gain is always 0 dB.

TABLE 3

Computation of the inverse encoder DRC characteristics 1 to 6

```
inverseCompressorIO(gainQuant) {
    drcInputLoudnessTarget = −31;
    gainDbMin = −32.0;
    gainDbMax = 32.0;
    if (gainQuant >= 0.0)
        tmp = gainQuant / pow(1 − pow(gainQuant / gainDbMax,
expLo), 1 / expLo);
    else
        tmp = gainQuant / pow(1 − pow(gainQuant / gainDbMin,
expHi), 1 / expHi);
    inLev = drcInputLoudnessTarget − tmp / ioRatio;
    return inLev;
}
```

TABLE 4

Parameters of DRC characteristics 1 to 6

| Parameter | DrcCharacteristic | | | | | |
|---|---|---|---|---|---|---|
| | 1 | 2 | 3 | 4 | 5 | 6 |
| ioRatio | 0.8 | 0.0 | 0.2 | 0.4 | 0.6 | 1.0 |
| expLo | 6.0 | 9.0 | 9.0 | 9.0 | 9.0 | 5.0 |
| expHi | 8.0 | 12.0 | 12.0 | 12.0 | 12.0 | 6.0 |

Decoder DRC target characteristics are not considered to be standardized. They can be optionally defined by an implementer to achieve customized compression characteristics. Sections below explain how the gain mapping is applied in more detail.

The Sample Description may include a total of 11 encoder DRC characteristics. For compatibility with existing systems the Sample Description contains in addition to the first 6 characteristics described above and shown in FIG. 3, five more characteristics that may be available in ATSC systems as shown in Table 5.

TABLE 5

Indices of encoder DRC characteristics 7 to 11

| Index of characteristic (DRC_characteristic) | Name of Profile[5] |
|---|---|
| 7 | Film Light |
| 8 | Film Standard |
| 9 | Music Light |
| 10 | Music Standard |
| 11 | Speech |

Spline Segments

Figure 5:
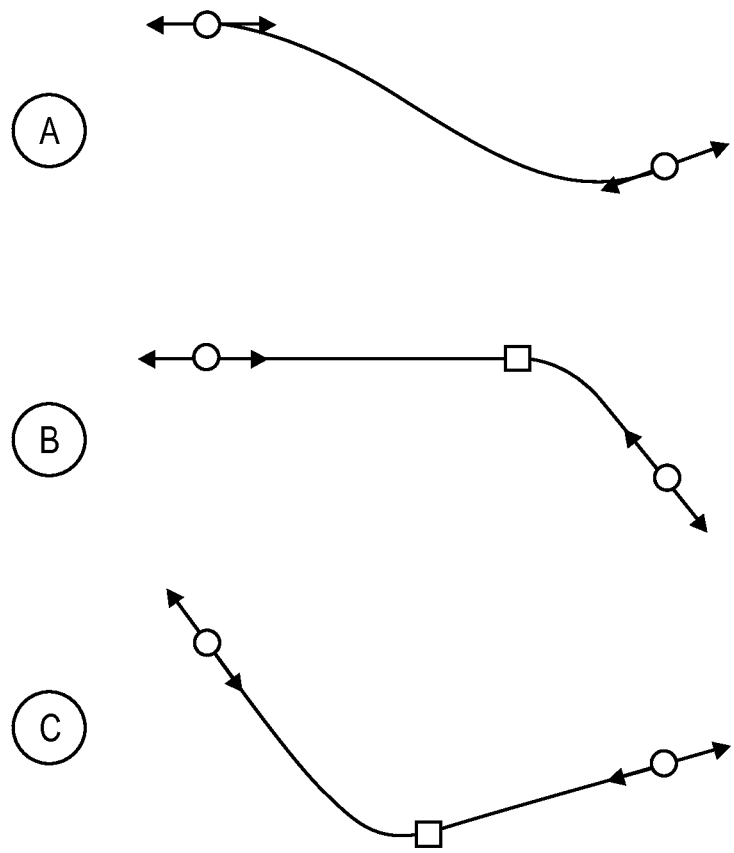
FIG. 5 shows example types of interpolation according to one embodiment.

Interpolation of the DRC gain in the decoder is based on pairs of gain samples. Each pair has gain coordinates (time and value in dB) and slope information. The decoder will choose one of three available types of interpolation as illustrated in FIG. 5. In most cases, cubic interpolation, which is shown by spline segment A in FIG. 5, is chosen. However, under certain conditions, a hybrid interpolation is applied instead that combines linear and quadratic interpolation as shown by spline segments B and C in FIG. 5. For the hybrid interpolation, a node is inserted between the two gain coordinates (shown as squares in spline segments B and C in FIG. 5). On one side of that node, linear interpolation is applied and quadratic interpolation is applied on the other. This method is fully specified below.

Framing

The DRC gain information is organized in DRC frames. Each DRC frame contains DRC data to generate the DRC gain for the duration of a DRC frame. The DRC frame duration is constant for a given audio item and it is a multiple of the audio sample interval. DRC frames do not overlap. In practice, whenever suitable, the DRC frame size is recommended to be identical to the codec's frame size to minimize delay and complexity. This may be the default setting.

Time Resolution

The DRC tool uses a uniform time grid to generate a sparse representation of the DRC gain. The spacing of this grid defines the highest available time resolution delta_t_min. The unit of delta_t_min is one sample interval at the audio sample rate. For complexity reasons, delta_t_min is chosen to be an integer multiple of the audio sample interval with a corresponding duration between [0.5 . . . 1.0] ms. Preferably, delta_t_min is an integer power of 2, so that sample rates can be efficiently converted between audio and DRC. The default values are computed based on the following equation:

$$\text{delta\_t\_min} = 2^M \text{ where } f_s 0.0005 \text{ s} < \text{delta\_t\_min} \quad f_s 0.001 \text{ s} \quad (1)$$

In the above equation, the audio sample rate $f_s$ is in Hz, and the exponent M is a non-negative integer.

Look-Ahead in Decoder

The DRC tool decoder can be operated in one of two delay modes. The low-delay mode immediately applies the decoded DRC gain while the default mode applies the DRC gain with a delay of one DRC frame. The default mode supports gain sample interpolation from any position of the current DRC frame to any position of the next DRC frame. The low-delay mode requires that a gain value sample is located at the end of the DRC frame.

Figure 6:
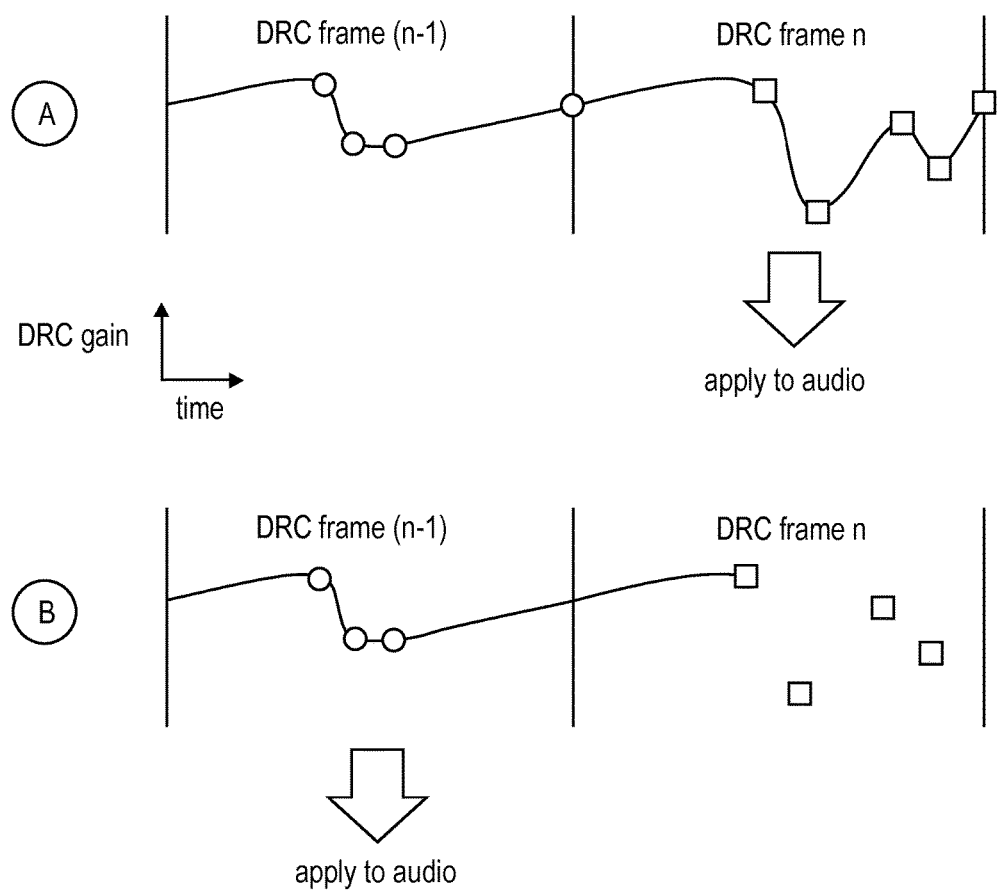
FIG. 6 shows two delay modes according to one embodiment.

FIG. 6 illustrates the two delay modes: a low delay A and a default delay B. The upper diagram A shows that each DRC frame has a spline node at the end of the frame, so that the entire DRC gain curve for that frame can immediately be generated by interpolation. The lower diagram B shows that the interpolated gain curve is applied with a delay of one DRC frame, since the interpolation for frame n−1 (represented by a circle) can only be completed after the first node of frame n (represented by a square) is received.

For common perceptual codecs the default delay mode B will not require additional decoder delay. The delay is already required due to the overlap add operation.

The low-delay mode may be suitable for decoders that don't have inherent delay such as a delay due to overlap add. For instance, this is the case for some lossless codecs.

Decoding

The decoding process of the gain coordinates and slopes consists of the following sequence of tasks:

Gather the DRC configuration information

Parse the DRC bitstream

Apply the code tables including Huffman decoding to decode the quantized values

Undo the differential encoding

The DRC configuration information may be part of the Sample Description. The DRC configuration information may include the following parameters relevant for decoding:

The number of gain sequences: nDrcGainSequences

The assignment of a gain sequence to each channel. Channels using the same sequence are referred to as channel groups. The total number of groups is nDrcChannelGroups The number of DRC bands in a group: nDrcBands Given these parameters, the DRC bitstream can be parsed according to Table 20 and Table 21. In the following, the pseudo code is limited to one gain sequence for clarity. For the general case, an outer loop may be added to process each gain sequence in Table 6 and Table 9.

The coded values are decoded by applying Table 22 and Table 25. This operation is expressed in Table 6 by the pseudo-functions decode_initial_gain( ), decode_delta_gain( ), decode_time_delta( ), and decode_slope( ). Differentially encoded values are then converted into absolute values according to Table 6. The decoded result is represented by the gain values gDRC[g][b][k], the time values tDRC[g][b][k], and the slope values sDRC[g][b][k] where g is the channel group index, b is the band index, and k is the spline node index. Time values are integer numbers relative to the beginning of the DRC frame in units of delta_t_min. The audio sample that coincides with the beginning of the DRC frame has a time value of tDRC=0.

TABLE 6

Decoding of DRC gain sample coordinates and slopes in the dB domain.

```
for(g=0; g<nDrcChannelGroups; g++) {
    for(b=0; b<nDrcBands[g]; b++) {
        gDRC[g][b][0] = decode_initial_gain(gain_initial_code[g][b]);
        if (drcGainCodingMode[g][b] == 0) {
            /* "simple" mode */
            tDRC[g][b][0] = drcFrameSize - 1;
            sDRC[g][b][0] = 0.0;
        }
        else
        {
            for (k=1; k<nNodes[g][b]; k++) {
                gDRC[g][b][k] = gDRC[g][b][k-1]+decode_delta_gain(gain_delta_code[g][b][k-1]);
            }
            tDRC[g][b][0] = delta_t_min * decode_time_delta(time_delta_code[g][b][0]) - 1;
            for (k=1; k<nNodes[g][b]; k++) {
                tDRC[g][b][k] = tDRC[g][b][k-1] +
                    delta_t_min * decode_time_delta(time_delta_code[g][b][k]);
            }
            for (k=0; k<nNodes[g][b]; k++) {
                sDRC[g][b][k] = decode_slope(slope_code[g][b][k]);
            }
        }
    }
}
```

Gain Modifications and Interpolation

As mentioned above under the heading "Modifying the DRC Characteristic", there are several ways to adapt the DRC characteristics in the DRC tool decoder. These adjustments are applied to the decoded gain samples in the dB domain.

The function toLinear( ) is introduced in Table 7 to include all necessary steps to generate a linear gain sample from the logarithmic value in dB (see Table 7). This function contains an optional mapping function mapGain( ) (see Table 2) that supports modifications of the DRC gain values with the purpose of achieving a different compression characteristic than the one used in the encoder. The mapping is controlled by the index characteristicIndex that will select one of the custom decoder DRC characteristics if it is larger than 0. Otherwise, the encoder characteristic will not be replaced. A modified characteristic can be generated based on the encoder compression characteristic that is conveyed in the Sample Description. Moreover, a compression and boost factor is supported to scale negative and positive gains, respectively. These factors have a value of 1.0, unless values in the range [0,1] are supplied by the user. Finally, the loudness normalization gain is applied.

Before the gain can be applied to the audio signal, the audio signal must be converted to the linear domain and gain values between gain samples must be interpolated. To achieve lower complexity, the dB to linear conversion may be done before the interpolation. Hence, the interpolation process is entirely done in the linear domain. Both, the gain modification and conversion to the linear domain are done using the pseudo code of Table 7. The input variables are the gain samples and slopes in the dB domain. The output consists of the gain samples and slopes in the linear domain. For loudness normalization, a loudness normalization gain value in dB (loudnessNormalizationGainsDb) can be supplied to the decoder by a loudness control tool or other means. If not supplied, a default value of 0.0 is used. In one embodiment, the normalization gain is calculated as the difference between the target loudness and the content loudness in dB FS. The target loudness is the desired output loudness level. The content loudness is equal to the program loudness or anchor loudness as defined in ISO/MPEG, "14496-12 PDAM 3—Enhanced Audio (File Format)", 106th MPEG meeting Geneva, Switzerland, October 2013. If both program loudness and anchor loudness are not supplied, a default value may be used for content loudness.

TABLE 7

Conversion of a DRC gain sample and associated slope from dB to linear domain

```
toLinear (gainDb, slopeDb) {
    SLOPE_FACTOR_DB_TO_LINEAR = 0.1151f      /* ln(10) /
                                                20 */
    gainRatio = 1.0;
    if (characteristicIndex > 0) {
        gainRatio = mapGain(gainDb) / gainDb;
    }
    if (gainDb < 0) {
        gainRatio *= compress;
    }
    else {
        gainRatio *= boost;
    }
    gainLin = pow(2.0, (gainRatio * gainDb +
        loudnessNormalizationGainDb) / 6);
    slopeLin = SLOPE_FACTOR_DB_TO_LINEAR * gainRatio *
        gainLin * slopeDb;
    return (gainLin, slopeLin)
}
```

The gain interpolation is implemented by the pseudo code in Table 8. The input variables are:

the time difference between the two gain samples in units of the target sample rate interval tGainStep a pair of subsequent gain samples gain0 and gain1 in dB a pair of corresponding slope steepness values slope0 and slope1 in the dB domain.

This function uses toLinear( ) to convert the variables to the linear domain. The result is a smooth sequence of gain values at the target sample rate located between the pair of gain samples. The target sample rate is the sample rate of the compressed audio signal.

TABLE 8

Interpolation of the DRC gain for one spline segment

```
interpolateDrcGain(tGainStep, gain0, gain1, slope0, slope1)
{
    int n;
    float k1, k2, a, b, c, d;
    float slopeLeft;
    float slopeRight;
    float gainLeft;
    float gainRight;
    (gainLeft, slopeLeft) = toLinear (gain0, slope0);
    (gainRight, slopeRight) = toLinear (gain1, slope1);
    slopeLeft = slopeLeft * delta_t_min;
    slopeRight = slopeRight * delta_t_min;
    bool useCubicInterpolation = TRUE;
    int tConnect;
    float tConnectFloat;
    if (abs(slopeLeft) > abs(slopeRight)) {
        tConnectFloat = 2.0 * (gainRight - gainLeft - slopeRight *
            tGainStep) /
                (slopeLeft - slopeRight);
        tConnect = (floor) (0.5 + tConnectFloat);
        if ((tConnect >= 0) && (tConnect < tGainStep)) {
            useCubicInterpolation = FALSE;
            result[0] = gainLeft;
            result[tGainStep] = gainRight;
            a = (slopeRight - slopeLeft) / (tConnectFloat +
                tConnectFloat);
            b = slopeLeft;
            c = gainLeft;
            for (n=1; n<tConnect; n++) {
                float t = (float) n;
                result[n] = (a * t + b ) * t + c;
            }
            a = slopeRight;
            b = gainRight;
            for ( ; n<tGainStep; n++) {
                float t = (float) (n - tGainStep);
                result[n] = a * t + b;
            }
        }
    }
    else if (abs(slopeLeft) < abs(slopeRight))
    {
        tConnectFloat = 2.0 * (gainLeft - gainRight + slopeLeft *
            tGainStep) /
                (slopeLeft - slopeRight);
        tConnectFloat = tGainStep - tConnectFloat;
        tConnect = (floor) (0.5 + tConnectFloat);
        if ((tConnect >= 0) && (tConnect < tGainStep)) {
            useCubicInterpolation = FALSE;
            result[0] = gainLeft;
            result[tGainStep] = gainRight;
            a = slopeLeft;
            b = gainLeft;
            for (n=1; n<tConnect; n++) {
                float t = (float) n;
                result[n] = a * t + b;
            }
            a = (slopeRight - slopeLeft) / (2.0 * (tGainStep -
                tConnectFloat));
            b = - slopeRight;
            c = gainRight;
            for ( ; n<tGainStep; n++) {
                float t = (float) (tGainStep-n);
                result[n] = (a * t + b ) * t + c;
            }
        }
    }
    if (useCubicInterpolation == TRUE)
    {
        float tGainStepInv = 1.0 / (float)tGainStep;
        float tGainStepInv2 = tGainStepInv * tGainStepInv;
        k1 = (gainRight - gainLeft) * tGainStepInv2;
        k2 = slopeRight + slopeLeft;
        a = tGainStepInv * (tGainStepInv * k2 - 2.0 * k1);
        b = 3.0 * k1 - tGainStepInv * (k2 + slopeLeft);
        c = slopeLeft;
        d = gainLeft;
        result[0] = gainLeft;
```

TABLE 8-continued

Interpolation of the DRC gain for one spline segment

```
            result[tGainStep] = gainRight;
            for (n=1; n<tGainStep; n++) {
                float t = (float) n;
                result[n] = (((a * t + b ) * t + c ) * t ) + d;
            }
        }
        return result;
}
```

Applying the Compression

The interpolated gain values of each spline segment are concatenated to generate a complete gain vector gain[g][b][t] for the entire DRC frame. Finally, the gain vector is applied as shown in Table 9. The function channelInDrc-Group( ) returns TRUE if the current channel c belongs to the current DRC channel group as specified in the Sample Description. Please note that the scheduling of the spline segments depends on the delay mode (see the section above labeled "Look-ahead in Decoder") as indicated in Table 9.

TABLE 9

Concatenation of spline segments to a gain vector and application of the DRC gain vector to the audio channels.

```
for(g=0; g<nDrcChannelGroups; g++) {
    for(b=0; b<nDrcBands[g]; b++) {
        if (delayMode == DELAY_MODE_DEFAULT) {
            for (k=0; k<nNodesPrev[g][b]-1; k++) {
                duration = tDRCprev[g][b][k+1] - tDRCprev[g][b][k];
                splineSegment = interpolateDrcGain(duration,
                    gDRCprev[g][b][k],
                        gDRCprev[g][b][k+1], sDRCprev[g][b][k],
                        sDRCprev[g][b][k+1]);
                for (t=0; t<duration; t++)
                {
                    gain[g][b][t+tDRCprev[g][b][k]] =
                    splineSegment[t];
                }
            }
            k = nNodesPrev[g][b]-1;
            duration = drcFrameSize + tDRC[g][b][0] -
                tDRCprev[g][b][k];
            splineSegment = interpolateDrcGain(duration,
                gDRCprev[g][b][k],
                        gDRC[g][b][0], sDRCprev[g][b][k],
                        sDRC[g][b][0]]);
            for (t=0; t<duration; t++)
            {
                gain[g][b][t+tDRCprev[g][b][k]] = splineSegment[t];
            }
        }
        else
        {
            for (k=0; k<nNodes[g][b]-1; k++) {
                duration = tDRC[g][b][k+1] - tDRC[g][b][k];
                splineSegment = interpolateDrcGain(duration,
                    gDRC[g][b][k],
                        gDRC[g][b][k+1], sDRC[g][b][k],
                        sDRC[g][b][k+1]);
                for (t=0; t<duration; t++)
                {
                    gain[g][b][t+tDRC[g][b][k]] = splineSegment[t];
                }
            }
        }
        /* Apply gain to DRC bands of audio in each channel */
        for (c=0; c<nChannels; c++) {
            if (channelInDrcGroup(c, g)) {
                for (t=0; t<drcFrameSize; t++) {
                    audioBandOut[c][b][t] = audioBandIn[c][b][t] *
                        gain[g][b][t];
                }
            }
        }
```

TABLE 9-continued

Concatenation of spline segments to a gain vector and application of the DRC gain vector to the audio channels.

```
        }
        if (delayMode == DELAY_MODE_DEFAULT)
        {
            for (k=0; k<nNodes; k++) {
                gDRCprev[g][b][k] = gDRC[g][b][k];
                sDRCprev[g][b][k] = sDRC[g][b][k];
                tDRCprev[g][b][k] = tDRC[g][b][k];
            }
            nNodesPrev[g][b] = nNodes[g][b];
            for (t=0; t<drcFrameSize; t++) {
                gain[g][b][t] = gain[g][b][t + drcFrameSize];
            }
        }
    }
}
for(g=0; g<nDrcChannelGroups; g++) {
    for(c=0; c<nChannels; c++) {
        if (channelInDrcGroup(c, g)) {
            for (t=0; t<drcFrameSize; t++) {
                sum = 0.0;
                for(b=0; b<nDrcBands[g]; b++) {
                    sum = sum + audioBandOut[c][b][t];
                }
                audioSampleOut[c][t] = sum;
            }
        }
    }
}
```

Table 9 is based on the following assumptions:

splineSegment is a vector that contains the gain values of one spline segment.

duration is an integer number describing the duration of the spline segment in units of audio sample intervals.

nNodes is the number of gain values in the current DRC frame.

drcFrameSize is the number of audio sample intervals in a DRC frame.

Initialize the following variables if delayMode=DELAY_MODE_DEFAULT:
gDRCprev[g] [b] [0]=0.0, sDRCprev[g] [b] [0]=0.0; tDRCprev[g] [b] [0]=drcFrameSize; nNodesPrev[g][b]=1.

Multi-Band DRC Filter Bank

When the DRC gains are applied in the time domain and a multi-band DRC is used, the time-domain audio signal must be split into sub-bands before the DRC gain is applied to the bands. The filter configuration parameters may be conveyed by the DRCInstructions( ) defined in the MPEG File Format. The MPEG File Format may provide the bitstream syntax for the number of bands and the crossover frequency indices between bands.

Figure 7:
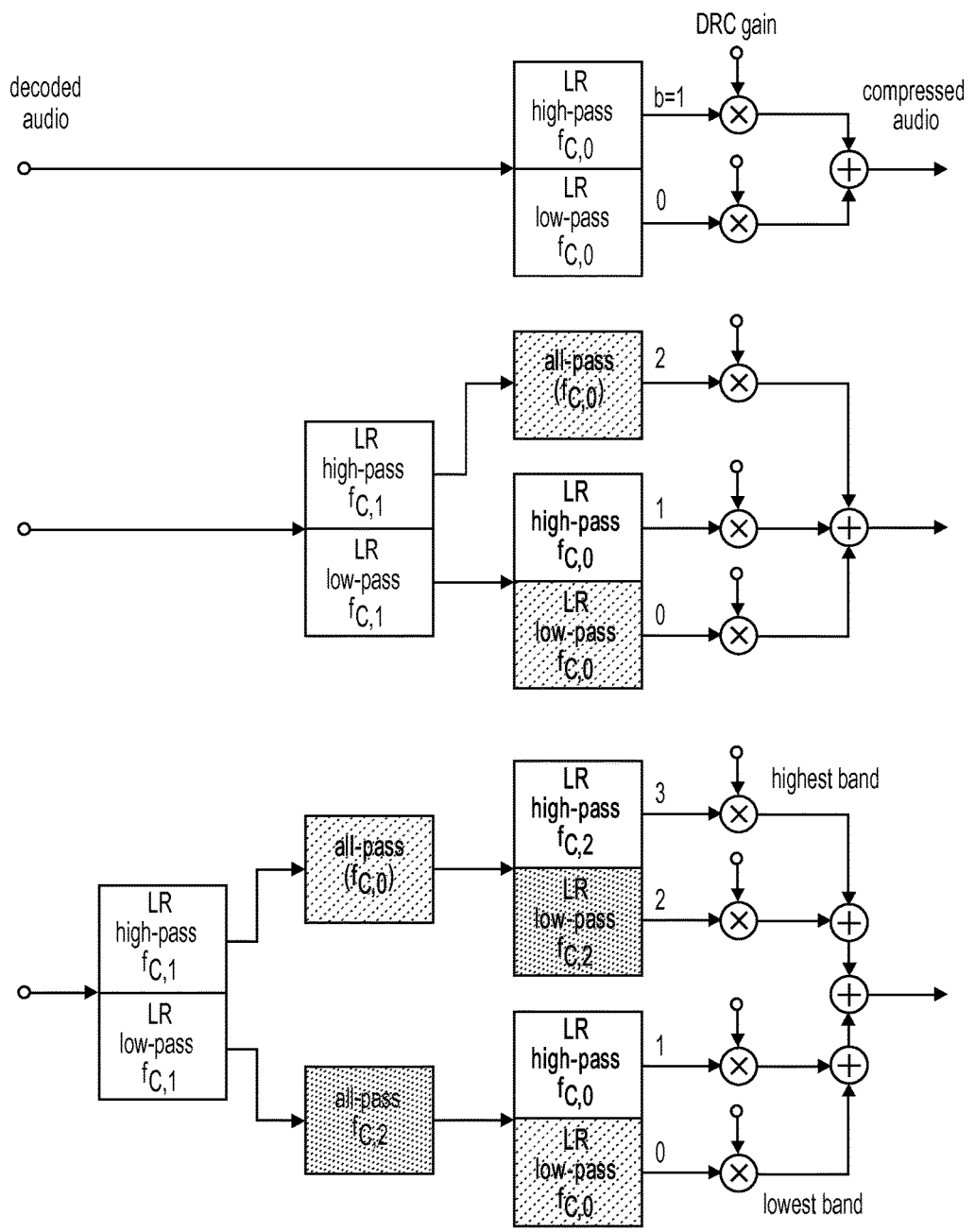
FIG. 7 shows the topology of Linkwitz-Riley crossover filters according to one embodiment.

The time-domain audio signal is split into the specified number of bands by Linkwitz-Riley (LR) filters with a topology shown in FIG. 7. The topology of Linkwitz-Riley crossover filters for 2, 3, and 4 bands is shown in FIG. 7. As shown in FIG. 7, the band index b increases with the frequency of the band. The crossover frequencies increase with index b (i.e., $f_{C,b+1} > f_{C,b}$). Crossover frequencies in brackets of an all-pass filter specify the corresponding LR low-pass filter with the matching phase response. If there are more than two bands, all-pass filters are added to compensate for the delay of the different outputs, so that they are all in phase. The low-pass and high-pass filters are implemented as second order sections (biquads).

As shown in FIG. 7, each Linkwitz-Riley (LR) crossover filter is composed of a pair of a complementing low-pass and high-pass filters that result in a flat frequency response. Each LR low-pass filter is created by a cascade of two identical Butterworth (BW) low-pass filters. Similarly each LR high-pass filter is a cascade of two identical BW high-pass filters with the same order and cutoff frequency as the BW low-pass filters.

Each BW filter and each all-pass filter is implemented as second order section with the following transfer function.

$$H(z) = \frac{b_0 + b_1 z^{-1} + b_2 z^{-2}}{a_0 + a_1 z^{-1} + a_2 z^{-2}} \quad (2)$$

Based on the crossover frequency indices in Table 26, the decoder can look up the normalized crossover frequencies $f_{c,Norm}$ or the filter coefficient parameters γ and δ. The filter coefficients are then computed using Table 10 for the BW filters and Table 11 for the all-pass filters. The crossover frequencies $f_c$ in Hz are computed by:

$$f_c = f_s \cdot f_{c,Norm}. \quad (3)$$

In case of multi-rate decoder configurations such as dual-rate HE-AAC, $f_s$ is the sample rate of the final output signal.

TABLE 10

Butterworth filter coefficient formulas

| | BW low-pass | BW high-pass |
|---|---|---|
| Normalized cutoff frequency | $\omega_0 = \tan(\pi f_{c,Norm})$ | |
| Intermediate parameters | $\delta = \frac{1}{1 + \sqrt{2}\,\omega_0 + \omega_0^2}$ | |
| | $\gamma = \omega_0^2 \delta$ | |
| Final BW filter coefficients | $a_{LP,0} = 1$ | $a_{HP,0} = 1$ |
| | $a_{LP,1} = 2(\gamma - \delta)$ | $a_{HP,1} = 2(\gamma - \delta)$ |
| | $a_{LP,2} = 2(\gamma + \delta) - 1$ | $a_{HP,2} = 2(\gamma + \delta) - 1$ |
| | $b_{LP,0} = \gamma$ | $b_{HP,0} = \delta$ |
| | $b_{LP,1} = 2\gamma$ | $b_{HP,1} = -2\delta$ |
| | $b_{LP,2} = \gamma$ | $b_{HP,2} = \delta$ |

The all-pass filters in FIG. 7 are used to generate the same phase response as one of the LR low-pass filters (with matching gray level and matching $f_c$ in FIG. 7) so that the signals of all bands are in phase at the output of the filter bank. The all-pass filter coefficients are derived from the coefficients of the corresponding BW low-pass filter as shown in Table 11.

TABLE 11

All-pass filter coefficient formulas $a_{AP,0} = a_{LP,0}$
$a_{AP,1} = a_{LP,1}$
$a_{AP,2} = a_{LP,2}$
$b_{AP,0} = a_{LP,2}$
$b_{AP,1} = a_{LP,1}$
$b_{AP,2} = a_{LP,0}$ After the DRC gains are applied to the individual bands, the final audio signal is computed by adding all bands.

DRC Applied to Decoder's Sub-Band Domain

While the application of DRC gains in the time-domain is mandatory for AAC, other MPEG codecs use sub-band domain DRC. The concept of sub-band domain DRC means that the existing sub-band signals of the decoder are subject to the DRC gain application. Therefore, it is not necessary to add time-domain band splitting for a multi-band DRC and it is possible to apply DRC gains before rendering and/or downmixing in the frequency domain. Table 12 contains a non-exhaustive list of codecs and the domain where the DRC gain is applied. The domain may depend on the decoder configuration and not on the bitstream. For instance, if MPEG-Surround is decoded with a plain AAC decoder, the DRC gains are applied in the time domain. Furthermore, the sub-band domain may not be the MDCT domain of a core codec. Instead, the sub-band domain is usually the QMF domain.

TABLE 12

Domain of DRC gain applications for various MPEG decoders

| Decoder | Time-domain DRC | Sub-band DRC |
|---|---|---|
| AAC | ✓ | |
| HE-AAC | | ✓ |
| MPEG-Surround | | ✓ |
| SAOC | | ✓ |
| USAC | | ✓ |
| 3D Audio | | ✓ |

To achieve multi-band compression, the compressor bands are mapped to groups of decoder sub-bands. There is no need to do additional filtering. The DRC crossover frequencies are mapped to the closest decoder sub-band crossover frequency available. Given the no alized sub-band crossover frequencies $f_{c,Norm,SB}(s)$ for sub-band s, the mapped crossover frequency of $f_{c,Norm}(b)$ is:

if
$f_{c,Norm,SB}(s) \leq f_{c,Norm}(b) \leq f_{c,Norm,SB}(s+1)$:

$$f_{c,Norm,Mapped}(b) = \quad (4)$$
$$\begin{cases} f_{c,Norm,SB}(s); & \text{if } f_{c,Norm}(b) < 0.5(f_{c,Norm,SB}(s) + f_{c,Norm,SB}(s+1)) \\ f_{c,Norm,SB}(s+1); & \text{else} \end{cases}$$

The DRC gains may be decoded as described above. The DRC gains may be interpolated using the same technique as described in Table 8 and Table 9, however, the sampling rate of the interpolation result is lowered to match the sample rate of the sub-band signals. This can be achieved by sub-sampling the interpolated time-domain DRC gains by a factor of L or by directly interpolating using the sub-band sample rate as target.

Figure 8:
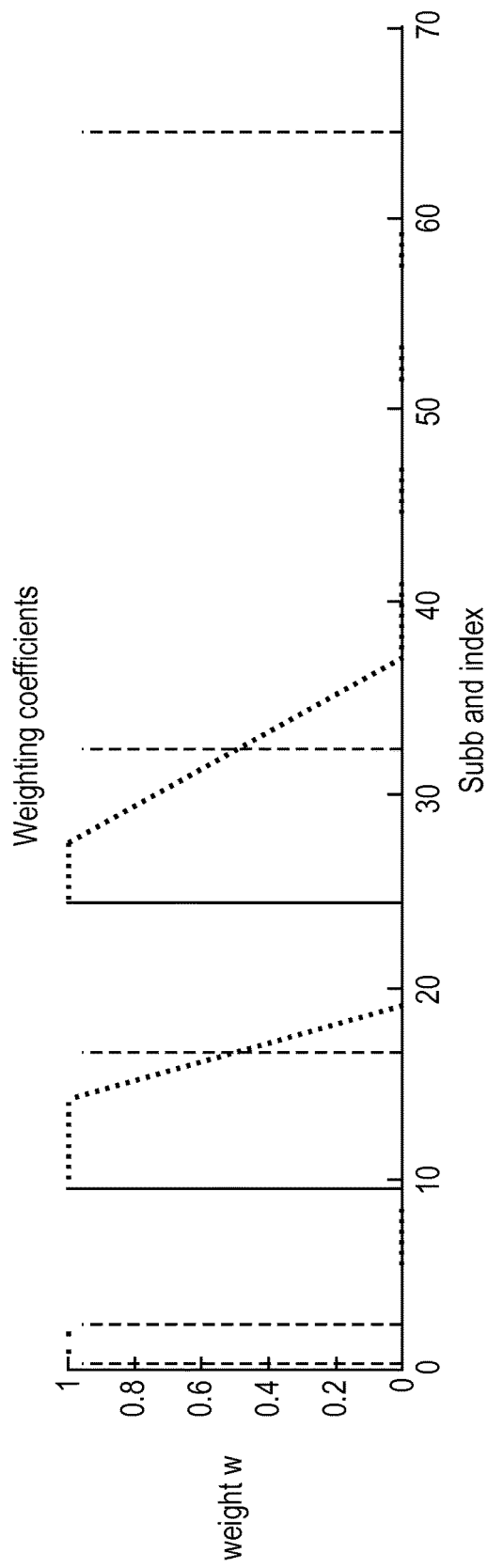
FIG. 8 shows examples of weighting coefficients for a 4-band DRC utilizing a filter bank with 64 sub-bands according to one embodiment.

To avoid sharp spectral transitions between the DRC bands, there may be a "cross-fade" between the gains of neighboring DRC bands. This operation is called overlapping. The overlapping is controlled by weight coefficients w, one for each sub-band. The weight coefficients w may be computed according to Table 14 and determine the contribution of the DRC gain of the current band and that of the next band. FIG. 8 shows an example of weighting coefficients for a four-band DRC utilizing a filter bank with 64 sub-bands. Band edges in FIG. 8 are denoted by dashed lines, band centers are denoted by solid lines, and weights are denoted by dotted lines.

After the overlap, the DRC gains of each compressor band are applied to each sub-band group corresponding to the compressor band. A small time delay D to account for the filter bank delay is added to the DRC gains to achieve proper time alignment with the audio signal. The down-sampling and delay operations can be expressed by the first part of pseudo code in Table 13. The values of the two parameters are discussed as codec-specific values below. The meaning of variables and functions of the pseudo code in Table 13 is explained in Table 15. The description assumes that the sample rates in all sub-bands are equal. If this is not the case, the down-sampling factor L may be adjusted for the different sub-band sample rates.

TABLE 13

DRC gain down-sampling, overlap, and application in decoder sub-bands

```
/* resample DRC gain */
for (g=0; g<nDrcChannelGroups; g++) {
    for (b=0; b<nDrcBands[g]; b++) {
        for (m=0; m<drcFrameSizeSb; m++) {
            gainLr[g][b][m]=gain[g][b][m*L-D];
        }
    }
}
/* Overlap DRC gains in crossover regions
for (g=0; g<nDrcChannelGroups; g++) {
    s=0;
    for (b=0; b<nDrcBands-2; b++) {
        while (fCenterSubband[s] < 0.5*(fCross[g][b] + fCross[g][b+1])) {
            for (m=0; m<drcFrameSizeSb; m++) {
                gainSb[g][s][m] = w[g][s]*gainLr[g][b][m]+(1-w[g][s])*gainLr[g][b+1][m];
            }
            s++;
        }
    }
    for ( ; s<nDecoderSubbands; s++) {
        for (m=0; m<drcFrameSizeSb; m++) {
            gainSb[g][s][m] = w[g][s]*gainLr[g][b][m]+(1-w[g][s])*gainLr[g][b+1][m];
        }
    }
}
/* apply DRC gain in sub-bands */
for (g=0; g<nDrcChannelGroups; g++) {
    for (c=0; c<nChannels; c++) {
        if (channelInDrcGroup(c, g)) {
            for (s=0; s<nDecoderSubbands; s++) {
                for (m=0; m<drcFrameSizeSb; m++) {
                    audioSampleSbOut[c][s][m]=gainSb[g][s][m]*audioSampleSbIn[c][s][m];
                }
            }
        }
    }
}
```

TABLE 14

Computation of overlap weights.

```
/* Overlap DRC gains in crossover regions
olapSize = 0.15;
for (g=0; g<nDrcChannelGroups; g++) {
    bwLeft = 2*fCross[g][0];
    s=0;
    for (b=0; b<nDrcBands-2; b++) {
        olap = olapSize * fCross[g][b];
        fStart = fCross[g][b] - min(0.5*bwLeft, olap);
        bwRight = fCross[g][b+1] - fCross[g][b];
        fStop = fCross[g][b] + min(0.5*bwRight, olap);
        while (fCenterSubband[s] <= fStart) {
            w[g][s] = 1.0;
            s++;
        }
        while (fCenterSubband[s] <= fStop) {
            w[g][s] = (fCross[g][b] + olap - fCenterSubband[s]) /
                      (2 * olap);
            s++;
        }
        while (fCenterSubband[s] <= 0.5 * (fCross[g][b] +
fCross[g][b+1])) {
            w[g][s] = 0.0;
            s++;
        }
```

TABLE 14-continued

Computation of overlap weights.

```
    }
    bwLeft = bwRight;
}
olap = olapSize * fCross[g][b];
```

TABLE 14-continued

Computation of overlap weights.

```
fStart = fCross[g][b] - min(0.5*bwLeft, olap);
bwRight = 0.5 - fCross[g][b];
fStop = fCross[g][b] + min(bwRight, olap);
while (fCenterSubband[s] <= fStart) {
    w[g][s] = 1.0;
    s++;
}
while (fCenterSubband[s] <= fStop) {
    w[g][s] = (fCross[g][b] + olap - fCenterSubband[s]) /
              (2 * olap);
    s++;
}
while (s < nDecoderSubbands) {
    w[g][s] = 0.0;
    s++;
}
}
```

TABLE 15

Explanation of code items

| Code item | Meaning |
|---|---|
| gainSb | DRC gain to be applied to decoder sub-bands |
| gainLr | Low-rate (resampled) DRC gain |
| fCross | Normalized crossover frequency |
| drcFrameSizeSb | Number of sub-band samples per sub-band in one audio frame |
| nDecoderSubbands | Number of decoder sub-bands |
| fCenterSubband | Center frequency of decoder sub-band |
| w0, w1 | Weights for gain overlap |
| olapSize | Size of overlap region relative to crossover frequency |
| olap | Size of overlap region in normalized frequency units |
| audioSampleSbIn | Decoded sub-band audio sample before dynamic compression |
| audioSampleSbOut | Decoded sub-band audio sample after dynamic compression |

DRC Configuration for Legacy Streaming Scenarios

The DRC configuration information may be conveyed by the MPEG File Format syntax. However, if a legacy streaming format such as ADTS is used to carry an MPEG Audio stream that doesn't support MPEG File Format, the configuration information may be embedded in the audio stream. This can be achieved by adding the AudioSampleEntry( ) syntax (or a compressed version of it) of the File Format to the uni_drc_info( ) syntax. Since the sample entry information is only required at a lower rate than the frame rate, a presence flag can be used that indicates when this information is available. The extended syntax is given in Table 16.

TABLE 16

Syntax of extended uni_drc_info( ) payload with Sample Entry field.

```
uni_drc_info( )
    sampleEntryPresent;           1 uimsbf
    if (sampleEntryPresent == 1) {
        AudioSampleEntry( )
    }
    for (s=0; s<nDrcGainSequences; s++) {
        drc_gain_sequence( )
    }
```

For this case, the DRC information can only be decoded after the Sample Entry has been received by the decoder. The repetition rate of the Sample Entry information determines the decoding delay.

Precedence

If a bitstream contains the proposed DRC metadata and other DRC metadata such MPEG light or heavy compression, the proposed metadata will take precedence unless the decoder is instructed to apply the other DRC metadata.

Decoder Specific Information

Advanced Audio Coding (AAC)

DRC Metadata Extension for AAC

For AAC a new extension payload with a new ID to carry the proposed DRC metadata in a Fill Element may be used. The IDs are encoded using a 4 bit code and currently only 7 are defined. Embedding this DRC information in a new extension payload guarantees backwards compatibility with existing decoders that will skip the new payload. The proposed new extension_type is given in Table 17. It contains uni_drc_info( ) as given in Table 20.

TABLE 17

Definition of new extension_type for AAC

| Symbol | Value of extension type | Purpose |
|---|---|---|
| UNI_DRC | 1111 | Unified DRC |

Delay Mode for AAC

AAC uses the default delay mode.

DRC Frame Size and Time Resolution for AAC

The DRC frame size has the default size (i.e., it has the same time duration as the AAC frame size).

The value of delta_t_min in number of samples at the audio rate is calculated as specified in section above labeled "Time resolution". Specific values are provided here for convenience based on the following formula and Table 18:

$$\Delta t_{min} = 2^M \quad (5)$$

The applicable exponent M may be found by looking up the audio sample rate range that fulfills:

$$f_{s,min} \leq f_s < f_{s,max} \quad (6)$$

TABLE 18

Table to determine the DRC time resolution for AAC

| $f_s$, min [Hz] | $f_s$, max [Hz] | M |
|---|---|---|
| 8000 | 16000 | 3 |
| 16000 | 32000 | 4 |
| 32000 | 64000 | 5 |
| 64000 | 128000 | 6 |

Given the codec frame size $N_{Codec}$, the DRC frame size in units of DRC samples at a rate of delta_t_min is:

$$N_{DRC} = N_{Codec} 2^{-M} \quad (7)$$

MPEG-D USAC

DRC Metadata Extension

In USAC the new extension payload can be carried in the extension payload element UsacExtElement. For that purpose a new extension element type is defined according to Table 19. The default codec dependent DRC settings apply.

TABLE 19

Definition of new usacExtElementType for USAC

| Symbol | Value of extension type | Purpose |
|---|---|---|
| ID_EXT_ELE_DRC | 3 | Unified DRC |

MPEG-4 HE-AAC, HE-AACv2, MPEG-D Surround, MPEG-D SAOC

DRC Metadata Extension

The DRC metadata may be carried with the AAC core stream as described above.

MPEG-4 HE-AAC, HE-AACv2, MPEG-D Surround, and MPEG-D SAOC are composed of a core decoder such as AAC-LC and one or more additional layers on top of this core decoder. The additional layers enhance the audio bandwidth or the number of audio channels compared to the core. For these decoders, the DRC gains should be applied to the sub-bands of the highest layer immediately before the synthesis filter bank but not after the rendering/mixing stage.

DRC Gain Applications in Sub-Bands

For the DRC gain application in the QMF domain, the time-domain DRC gains may be delayed by D time-domain sample intervals and down-sampled by a factor of L. The values of D and L depend on the configuration, such as single rate versus dual rate HE-AAC. Proper time alignment between DRC gains and the audio signal must be achieved for all configurations.

Bitstream Syntax

The DRC bitstream is defined in Table 20 and Table 21. Typically the DRC bitstream time_domain_drc_info( ) is carried in an extension payload field of the host codec.

TABLE 20

Syntax of uni_drc_info( ) payload

```
uni_drc_info( )
   for (s=0; s<nDrcGainSequences; s++) {
      drc_gain_sequence( )
   }
```

TABLE 21

Syntax of drc_gain_sequence( )

```
drc_gain_sequence( )
for(b=0; b<nDrcBands[g]; b++) {
   drcGainCodingMode[g][b];                       1 uimsbf
   if (drcGainCodingMode[g][b] == 0)
      gain_initial_code[g][b];                    9 uimsbf
   }
   else {
      k=0;
      do {
         slope_code[g][b][k++];                   1..10 vlclbf
      }
      while (slope_code[g][b][k-1] != slope_code_end_marker);
      nNodes[g][b] = k;
      for (k=0; k<nNodes[g][b]; k++) {
         time_delta_code[g][b][k];                1..12 vlclbf
      }
      gain_initial_code[g][b];                    9 uimsbf
      for (k=1; k<nNodes[g][b]; k++) {
         gain_delta_code[g][b][k-1];              1..11 vlclbf
      }
   }
}
```

TABLE 22

Encoding of the initial DRC gain value

| Encoding | Size | gainInitial in [dB] | Range |
|---|---|---|---|
| {s, m₁} | {1 bit, 8 bits} | $g_{DRC}(0) = (-1)^s m_1 2^{-3}$ | −31.875 . . . 31.875 dB, 0.125 dB step size |

TABLE 23

Encoding of DRC gain differences

| Codeword size [bits] | gainValueDelta binary encoding | gainDelta [dB] |
|---|---|---|
| 4 | 0x000 | −2.0 |
| 9 | 0x039 | −1.875 |
| 11 | 0x0E2 | −1.750 |
| 11 | 0x0E3 | −1.625 |
| 10 | 0x070 | −1.500 |
| 10 | 0x1AC | −1.375 |
| 10 | 0x1AD | −1.250 |
| 9 | 0x0D5 | −1.125 |
| 7 | 0x00F | −1.000 |
| 7 | 0x034 | −0.875 |
| 6 | 0x036 | −0.750 |

TABLE 23-continued

Encoding of DRC gain differences

| Codeword size [bits] | gainValueDelta binary encoding | gainDelta [dB] |
|---|---|---|
| 5 | 0x019 | −0.625 |
| 5 | 0x002 | −0.500 |
| 5 | 0x00F | −0.375 |
| 3 | 0x001 | −0.250 |
| 2 | 0x003 | −0.125 |
| 3 | 0x002 | 0.000 |
| 2 | 0x002 | 0.125 |
| 6 | 0x018 | 0.250 |
| 6 | 0x006 | 0.375 |
| 7 | 0x037 | 0.500 |
| 8 | 0x01D | 0.625 |
| 9 | 0x0D7 | 0.750 |
| 9 | 0x0D4 | 0.875 |
| 5 | 0x00E | 1.000 |

TABLE 24

Encoding of slope steepness

| Codeword size [bits] | Slope steepness binary encoding | Slope steepness |
|---|---|---|
| 7 | 0x058 | −3.0518 |
| 9 | 0x142 | −1.2207 |
| 8 | 0x0B2 | −0.4883 |
| 6 | 0x02A | −0.1953 |
| 6 | 0x029 | −0.0781 |
| 6 | 0x02D | −0.0312 |
| 3 | 0x004 | −0.0050 |
| 2 | 0x003 | 0.000 |
| 5 | 0x017 | 0.0050 |
| 6 | 0x02B | 0.0312 |
| 7 | 0x051 | 0.0781 |
| 10 | 0x287 | 0.1953 |
| 10 | 0x286 | 0.4883 |
| 8 | 0x0A0 | 1.2207 |
| 8 | 0x0B3 | 3.0518 |
| 1 | 0x000 | n/a (end marker) |

TABLE 25

Encoding of time differences with nNodesMax = $N_{DRC}$

| Codeword size [bits] | Time difference binary encoding | Time difference tDRC_delta |
|---|---|---|
| 1 | 0x000 | nNodesMax |
| 3 | 0x004 | 1 |
| 5 | 0x014 + (a-2) | a = [2 . . . 5] |
| 6 | 0x030 + (a-6) | a = [6 . . . 13] |
| 12 | 0xE00 + (a-14) | a = [14 . . . nNodesMax-1] |

TABLE 26

Coding of normalized crossover frequencies and associated filter coefficient parameters

| crossover_freq_index | $f_{cNorm}$ | γ | δ |
|---|---|---|---|
| 0 | 2/1024 | 0.0000373252 | 0.9913600345 |
| 1 | 3/1024 | 0.0000836207 | 0.9870680830 |
| 2 | 4/1024 | 0.0001480220 | 0.9827947083 |
| 3 | 5/1024 | 0.0002302960 | 0.9785398263 |
| 4 | 6/1024 | 0.0003302134 | 0.9743033527 |
| 5 | 2/256 | 0.0005820761 | 0.9658852897 |
| 6 | 3/256 | 0.0012877837 | 0.9492662926 |
| 7 | 2/128 | 0.0022515827 | 0.9329321561 |
| 8 | 3/128 | 0.0049030350 | 0.9010958535 |

TABLE 26-continued

Coding of normalized crossover frequencies and associated filter coefficient parameters

| crossover_freq_index | $f_{c,Norm}$ | $\gamma$ | $\delta$ |
|---|---|---|---|
| 9 | 2/64 | 0.0084426929 | 0.8703307793 |
| 10 | 3/64 | 0.0178631928 | 0.8118317459 |
| 11 | 2/32 | 0.0299545822 | 0.7570763753 |
| 12 | 3/32 | 0.0604985076 | 0.6574551915 |
| 13 | 2/16 | 0.0976310729 | 0.5690355937 |
| 14 | 3/16 | 0.1866943331 | 0.4181633458 |
| 15 | 2/8 | 0.2928932188 | 0.2928932188 |

Linear Interpolation DRC Encoding

Although described above in relation to encoding and decoding of gain values based using spline interpolation, in some embodiments gain values may be encoded and applied with the use of linear interpolation. For example, in one embodiment, DRC values may be encoded for a piece of sound program content using spline nodes as described above. In this embodiment, slope values between each of the spline nodes may be omitted from the bitstream. Instead, linear interpolation may be performed between spline nodes instead of spline interpolation. In this fashion, encoding of the DRC gain values may be simplified by avoiding generation of slope values.

Window-Based Overlap-Add DRC Gain Interpolation

In one embodiment, a window-based overlap-add gain interpolation method may be used for decoding DRC gain values. In this method, gain values are encoded and received in a similar fashion as described above. However, each gain value is used as a multiplier for a window (e.g., a vector of window coefficients) during decoding. The interpolated gain curve may thereafter be obtained by using an overlap-add method. For example, the interpolated DRC gain curve for a window may be the product of a gain value multiplied by a window. One reason for using windows is that an identical gain curve may be generated compared to a gain curve that results from standardized decoders, which apply gain values in sub-bands. Further, the window-based overlap-add gain interpolation method does not generate aliasing distortions. A more in-depth description of this window-based overlap-add gain interpolation method is described below by way of example.

Figure 9:
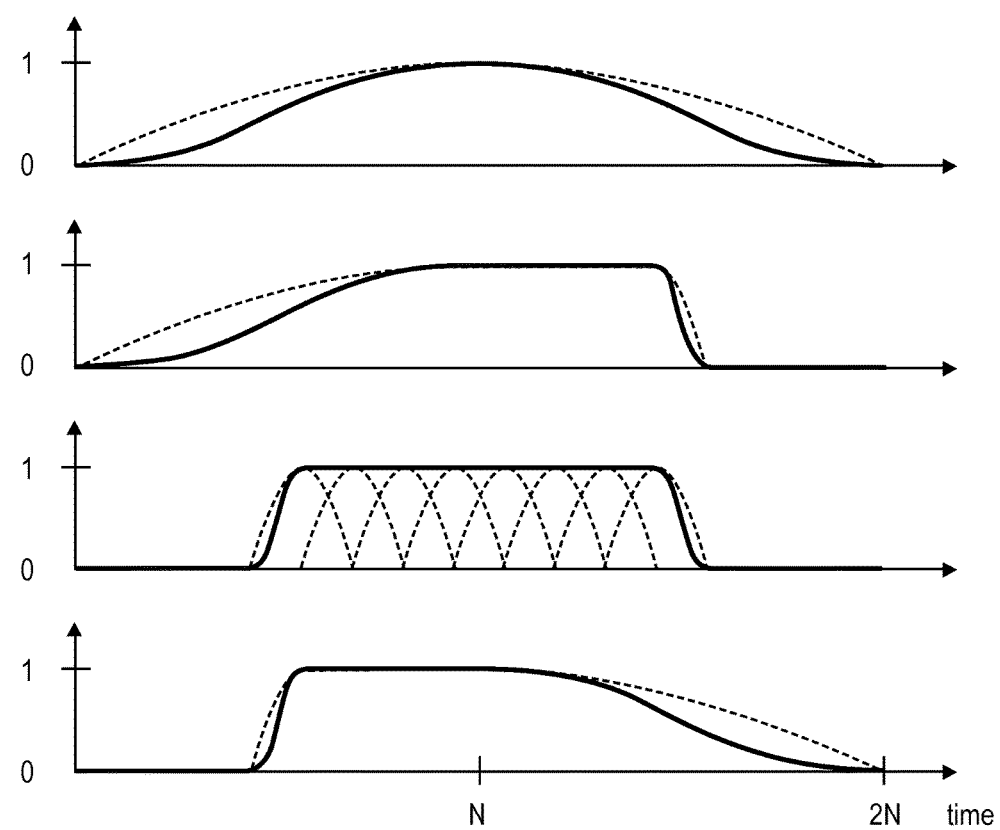
FIG. 9 shows Dynamic Range Control/Compression (DRC) window shapes to be used for certain corresponding decoder window shapes according to one embodiment.

FIG. 9 shows DRC window shapes (solid lines) to be used for certain corresponding decoder window shapes (dashed lines). From top-to-bottom, FIG. 9 shows an example long window, a transitional window from long to short, a short window, and a transitional window from short to long. The DRC windows may be computed by the square of the decoder synthesis window. The DRC window may be applied with the same timing as the corresponding decoder synthesis window.

The equation below illustrates how a DRC window is computed from a long AAC synthesis window with the AAC frame size N:

$$w_{DRC,long}(n) = w^2_{AAC,long}(n) \text{ for } n=[0,2N-1] \quad (8)$$

Short and transitional windows may be computed in a similar fashion. Equation (9) below shows the overlap-add process of subsequent DRC windows weighted by the DRC gain values derived from the bitstream. The time and frame indices are denoted n and k, respectively. The time index of 0 is located at the beginning of the current synthesis window (the first output sample of the current frame).

$$g(n) = g_{DRC}(k-1)w_{DRC}(k-1,N+n) + g_{DRC}(k)w_{DRC}(k,n)$$
$$\text{for } n=[0,N-1] \quad (9)$$

The DRC gain may then be applied to the decoder output signal $x_{AAC}$ according to equation (10) below to generate the final compressed audio output $x_{DRC}$. The DRC gain is not applied in the MDCT domain.

$$x_{DRC}(n) = g(n)x_{AAC}(n) \text{ for } n=[0,N-1] \quad (10)$$

When using light compression in MPEG, the multi-band DRC metadata may be used to apply independent DRC gain values to individual or grouped short blocks. In contrast to the label "Multi-band", each DRC gain may be encoded such that it is applied to the entire MDCT spectrum of a short block. Hence each DRC gain operates as a single-band DRC. If this is the case, the DRC operation can instead be done in the time-domain similarly as described above.

Figure 10:
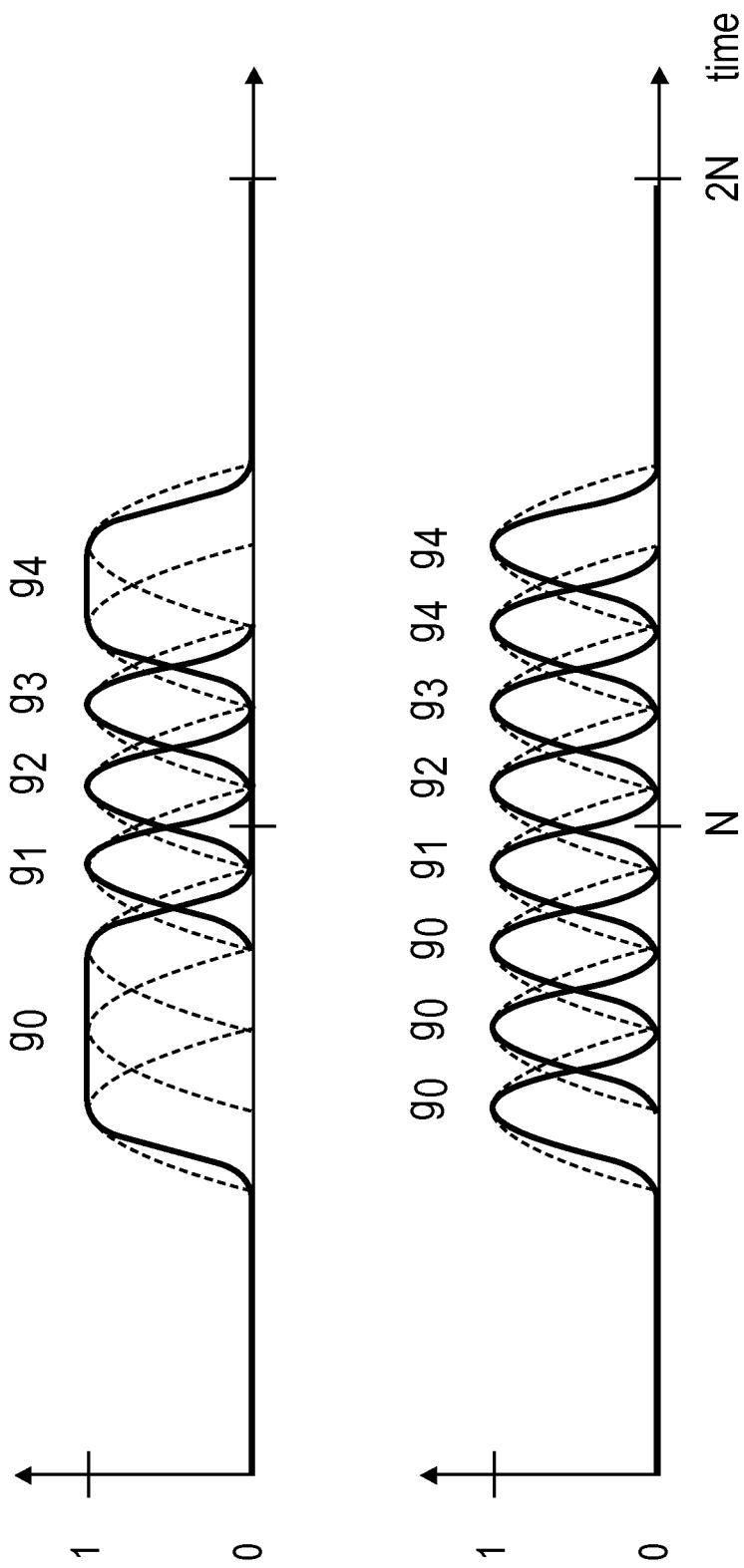
FIG. 10 shows DRC gain values applied to separate small blocks of a window according to one embodiment.

For example, if 5 DRC gain values are given for the 8 short blocks as shown in the top graph of FIG. 10, corresponding DRC windows are shown as solid lines. The bottom graph shows the usage of 8 short DRC windows with identical shape and the corresponding DRC gain values $g_0$ to $g_4$. The DRC windows can be derived from a short window shape using equation (8) with a parameter of N'=N/8. Equations (9) and (10) are applied correspondingly with the parameter N' instead of N.

In general, the bitstream syntax allows the independent choice of single-band or multi-band DRC for individual frames. With the time-domain DRC implementation described above, the decoder will switch to MDCT domain DRC processing whenever there is true multi-band DRC gain information ("true multi-band" meaning that there are unequal DRC gain values for different sub-bands).

This proposal includes a modified MPEG-AAC DRC implementation that avoids aliasing distortions in a backward compatible way for single band DRCs. Although described in relation to MPEG-AAC DRC, in other embodiments any type of bitstream audio may be used that includes frequency domain DRC gain values.

In the embodiment described above, the decoder is modified to apply DRC in the time domain. In another embodiment, an additional field may be added to the bitstream to increase the variability of DRC gain value application to the audio signal in the time domain. The new field for the DRC gain values may be defined in various locations in the bitstream syntax. For MPEG standards, one option is the definition of an additional extension payload carried in a Fill Element as shown in Table 27. In this embodiment, the audio channels of the program content may be grouped into DRC groups, where each group has an independent set of DRC information, i.e., a separate independent DRC is applied to each group of channels. An audio channel may only belong to one DRC group or none. The grouping information may be added to the Sample Description, which occurs once at the beginning of a track. In this embodiment, the number of DRC groups is called nDrcChannelGroups.

TABLE 27

Time domain DRC extension payload
Metadata sequence

```
For(g=0; g<nDrcChannelGroups-1; g++) {
    k=0;
    nDrcGainInfoBlocks[g];                    2 uimsbf
    for (b=0; b<nDrcGainInfoBlocks[g]; b++) {
        drcGainCodingMode[g][b];              2 uimsbf
        if (b==0) {
            gainInitial[g];                   9 uimsbf
            for (n=1; n<nDrcGainValues[g][b]; n++) {
                gainDelta[g][k++];            1..11 vlclbf
            }
```

TABLE 27-continued

Time domain DRC extension payload
Metadata sequence

```
        }
        else {
            for (n=0; n<nDrcGainValues[g][b]; n++) {
                gainDelta[g][k++];                1..11 vlcbf
            }
        }
    }
}
```

When observing the time-varying gain of practical implementations, it can be seen that the gain may change very slowly at times, while it can exhibit dramatic changes when the audio signal exhibits attacks. The necessary bit rate to encode the DRC gain values is reduced by supporting an individually selectable time resolution for each so-called drcGainInfoBlock. An audio frame is uniformly divided into up to 8 of these info blocks as shown in Table 28 and each of the blocks can contain up to 16 gain values.

The bit rate increase associated with a larger time resolution of the gain values is further mitigated by using an adaptive scheme with entropy coding of the gain changes. The DRC gain values can be transmitted in each audio frame using the syntax defined in Table 27.

TABLE 28

Lookup table for nDrcGainInfoBlocks

| Codeword | nDrcGainInfoBlocks | Comment |
|---|---|---|
| 0x0 | 1 | 1 block per frame |
| 0x1 | 2 | 2 blocks per frame |
| 0x2 | 4 | 4 blocks per frame |
| 0x3 | 8 | 8 blocks per frame |

The entry drcGainCodingMode determines the number of gain values for an info block as given in Table 29. There may be at least one gain value per frame to support random break-in. The first gain value is encoded according to Table 30. The remaining gain values are differentially encoded using Table 31 or Table 32 (depending on the drcGainCodingMode selected).

TABLE 29

Lookup table for drcGainCodingMode

| drcGainCodingMode (Codeword) | nDrcGainValues | drcDiffGainFactor | Comment |
|---|---|---|---|
| 0x0 | 1 | n/a | 1 value per frame |
| 0x1 | 4 | 1 | 4 value per frame |
| 0x2 | 16 | 1 | 16 values per frame |
| 0x3 | 16 | 4 | 16 values per frame |

TABLE 30

Representation of gainInitial

| Encoding | Size | gainInitial in [dB] | Range |
|---|---|---|---|
| {s, m₁} | {1 bit, 8 bits} | $g_{DRC}(0) = (-1)^s m_1 2^{-3}$ | −31.875 ... 31.875 dB, 0.125 dB step size |

TABLE 31

Encoding of DRC gain differences for drcGainCodingMode == 1

| gainValueDelta (binary code) | gainDelta [dB] (Resolution) |
|---|---|
| 00011000010 | −1.5 |
| 000110001 | −1.0 |
| 0001101 | −0.75 |
| 000111 | −0.5 |
| 0000 | −0.375 |
| 001 | −0.25 |
| 10 | −0.125 |
| 11 | 0.0 |
| 01 | 0.125 |
| 00010 | 0.25 |
| 00011001 | 0.375 |
| 0001100000 | 0.5 |
| 00011000011 | 1.0 |

TABLE 32

Encoding of DRC gain differences for drcGainCodingMode∈[2,3]

| gainValueDelta (binary code) | gainDelta [dB] (Resolution) |
|---|---|
| 1100001110 | −4.0 |
| 110000110 | −3.0 |
| 1100000 | −2.0 |
| 110001 | −1.5 |
| 11010 | −1.0 |
| 11011 | −0.75 |
| 1111 | −0.5 |
| 100 | −0.25 |
| 101 | −0.125 |
| 0 | 0.0 |
| 1110 | 0.125 |
| 11001 | 0.25 |
| 110000100 | 0.5 |
| 110000101 | 0.75 |
| 1100001111 | 1.25 |

TABLE 33

Decoding of logarithmic DRC gain values [dB]

```
float gDRC[ ][ ];
for(g=0; g<nDrcChannelGroups-1; g++) {
    int k=0;
    for (b=0; b<nDrcGainInfoBlocks[g]; b++) {
        if (b==0) {
            gDRC[g][k++] = gainInitial[g];
            for (n=1; n<nDrcGainValues[g][b]; n++) {
                gDRC[g][k] = gDRC[g][k-1] +
                    drcDiffGainFactor[g][b] * gainDelta[g][k-1];
                k++;
            }
        }
        else {
            for (n=0; n<nDrcGainValues[g][b]; n++) {
                gDRC[g][k] = gDRC[g][k-1] +
                    drcDiffGainFactor[g][b] * gainDelta[g][k-1];
                k++;
            }
        }
    }
    float gDRCPrev[g] = gDRC[g][k-1];
}
```

The non-uniform resolution of the difference values is motivated by psychoacoustics, such as the observation that deviations in the gain change are less audible the larger the gain change. Vice versa, if the gain is almost constant (and the audio envelope, too), deviations in gain changes are more audible. The asymmetric range is adapted to the fast acting DRC gain reduction for sudden attacks in the audio signal. Gain increases are usually slower.

A typical audio decoder reconstructs the audio signal using an overlap-add method with 50% overlap of subsequent blocks. Each of the blocks is weighted by a window that tapers off at either end. For instance, a typical frame size of MPEG-AAC is 1024 samples. For each new frame, the decoder reconstructs 2048 samples, the first 1024 of which are added to the last 1024 samples of the previous block and the result is the decoder output. The info blocks that come with frame k are scheduled uniformly during the second half of the reconstructed block. The gain values within each info block are distributed uniformly across the info block's duration. This scheme ensures that all necessary DRC gain values are available when decoding starts and ends, as well as for interpolation.

Figure 11:
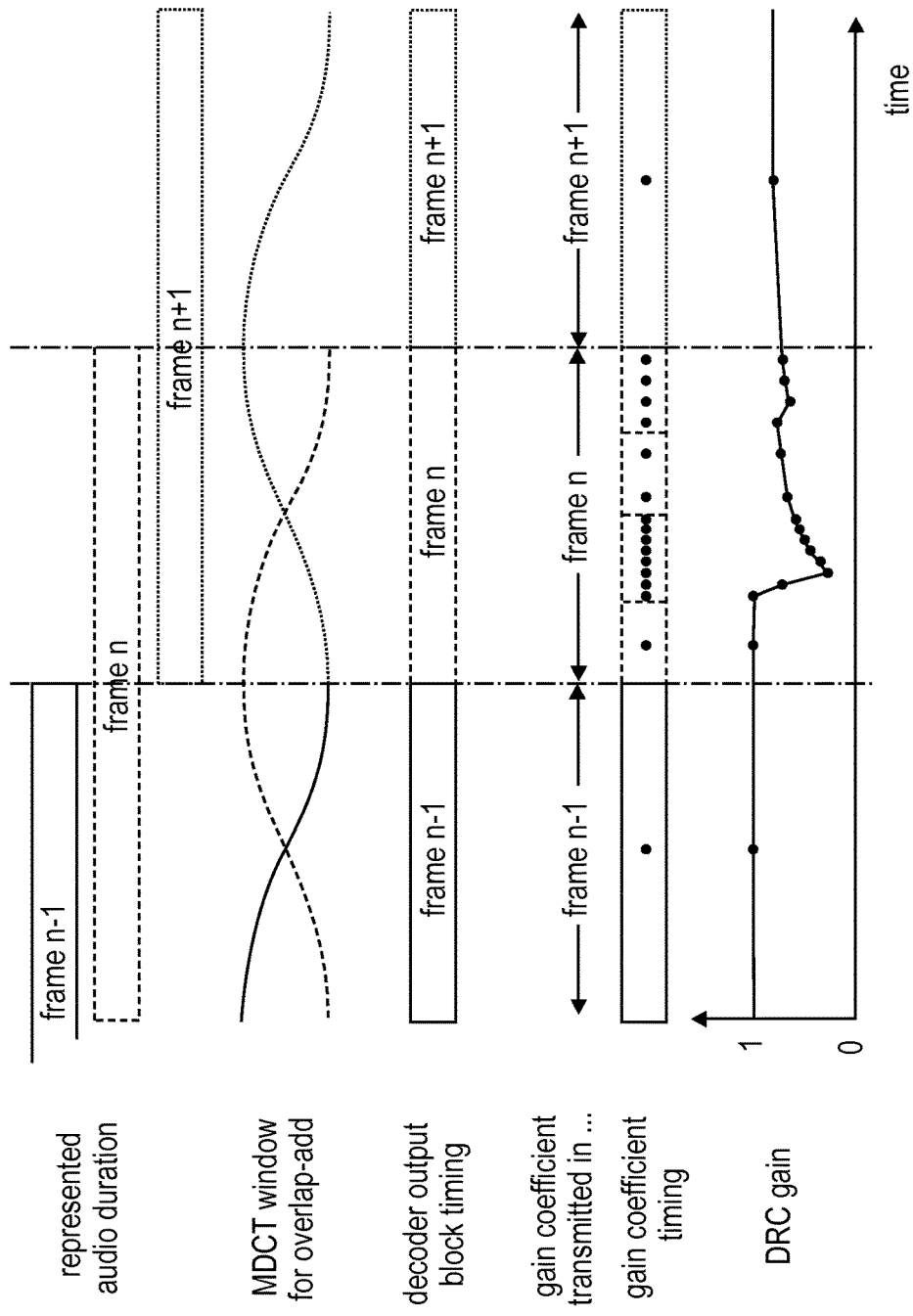
FIG. 11 shows DRC gain values applied across an audio signal according to one embodiment.

An example is shown in FIG. 11, where frame n of the bitstream contains DRC gains for the second half of the synthesis window. Frame n has 4 info blocks with 1, 8, 2, and 4 DRC gain values, respectively. The timing of the DRC gain values is computed based on a uniform distribution of gain values within each info block. Subsequently, linear interpolation is used to generate gain values for each time-domain audio sample.

TABLE 34

Computing the time locations of the DRC gain values

```
for(g=0; g<nDrcChannelGroups-1; g++) {
    int k=0;
    float tGainPrev = 0.0;
    float deltaPrev = 0.0;
    float samplesPerIblock = nFrame/nDrcGainInfoBlocks[g];
    for (b=0; b<nDrcGainInfoBlocks[g]; b++) {
        float delta = samplesPerIblock / nDrcGainValues[g][b];
        for (n=0; n<nDrcGainValues[g][b]; n++) {
            float tGain[g][k] = tGainPrev + 0.5 * (delta + deltaPrev);
            tGainPrev = tGain[g][k];
            deltaPrev = delta;
            k++;
        }
    }
}
```

The computation of the gain value timing is given in Table 34. The result tGain[g] [k] indicates the sample location in units of sample intervals starting with 0.0 at the first sample of the current output frame. The frame size is denoted $N_{frame}$ in samples.

Given the gain values and their timing, a smooth gain curve for all samples of the current output frame may be constructed by linear interpolation of the linear gain values as shown in Table 35. gDRCprev is the last DRC gain value of the previous frame. In this embodiment, the first gain value of the next frame is needed to interpolate the gain values of the frame for output. Due to the overlap-add process, that gain value is available without extra reading ahead in the bitstream. The function toLinear( ) is introduced to include all necessary steps to generate a linear gain value from the logarithmic value in dB.

TABLE 35

Interpolation of the DRC gain values

```
for(g=0; g<nDrcChannelGroups-1; g++) {
    int k=0;
    float tLeft = tGainPrev[g] - nFrame;
    float tRight = tGain[g][0];
```

TABLE 35-continued

Interpolation of the DRC gain values

```
    float gainLeft = toLinear(gDRCPrev[g]);
    float gainRight = toLinear(gDRC[g][0]);
    float factor = (gainRight-gainLeft)/(tRight - tLeft);
    for (t=0; t<nFrame; t++) {
        while (tTarget > tRight) {
            k++;
            tLeft = tRight;
            tRight = tGain[g][k];
            gainLeft = gainRight;
            gainRight = toLinear(gDRC[g][k]);
            factor = (gainRight-gainLeft)/(tRight - tLeft);
        }
        gain[g][t] = gainLeft + factor * (t - tLeft);
    }
}
```

Finally, the interpolated DRC gains are applied as shown in Table 36.

TABLE 26

Application of the DRC gain values

```
for(g=0; g<nDrcChannelGroups-1; g++)
    for (ch=0; ch<nChannels; ch++) {
        if (channelInDrcGroup(ch)) {
            for (t=0; t<nFrame; t++) {
                audioSampleOut[ch][t] = audioSampleIn[ch][t] *
                    gain[g][t];
            }
        }
    }
}
```

This embodiment described above includes improved DRC metadata encoding and processing for audio standards such as MPEG-Audio. Shortcomings of current standards, such as the generation of aliasing distortions and insufficient time resolution of the DRC metadata have been addressed.

As discussed above, multiple techniques may be used for encoding and applying DRC gain values for a piece of sound program content. In some embodiments, a method for applying frequency domain Dynamic Range Control (DRC) gain values to an audio signal in the time domain, comprises: receiving a bitstream, wherein the bitstream includes an encoded audio signal and frequency domain DRC gain values; decoding, by a decoder in a playback device, the encoded audio signal to produce a decoded audio signal in the time domain; determining, by the decoder, DRC window weights for applying the frequency DRC gain values to the decoded audio signal in the time domain; determining time domain DRC gain values based on the frequency domain DRC gain values and the DRC window weights; and applying the time domain DRC gain values for corresponding frames of the decoded audio signal in the time domain.

In one embodiment, the DRC window weights are determined based on a synthesis window of the decoder. In one embodiment, the DRC window weights are computed as the square of the decoder synthesis window with the same timing as the synthesis window of the decoder. In one embodiment, the DRC window weights are determined based on the product of the synthesis window of the decoder and a window of the encoder. In one embodiment, the time domain DRC gain values for a current frame of the decoded audio signal are determined based on the frequency domain DRC gain values for the current frame with a corresponding DRC window weight applied and the frequency domain DRC gain values for the previous frame with a corresponding DRC window weight applied. In one embodiment, applying the time domain DRC gain values to produce the DRC audio signal in the time domain is based on the product of the time domain DRC gain values and corresponding time divisions of the decoded audio signal. In one embodiment, one or more of the time domain DRC gain values are applied to an entire DRC window for the decoded audio signal. In one embodiment, the encoded audio signal is a Moving Picture Experts Group-Advanced Audio Coding (MPEG-AAC) DRC audio signal. In one embodiment, the encoded audio signal is an Advanced Television Systems Committee's (ATSC) DRC audio signal.

In another embodiment, a method of encoding Dynamic Range Control (DRC) gain values in a bitstream representing a piece of sound program content comprises: grouping each audio channel of the sound program content into a single DRC group from a set of DRC groups; and inserting DRC gain metadata into the bitstream for each DRC group, wherein the DRC gain metadata for each DRC group is used to variably apply corresponding DRC gain values to each frame in the DRC group. In one embodiment, the DRC gain metadata for each DRC group includes: a first data value representing a selected coding mode for an initial DRC gain value; a second data value representing the initial DRC gain value; and a third data value representing differences applied to the initial DRC gain value to generate the DRC gain values for each frame of the DRC group. In one embodiment, the first data value represents the number of gain values to apply to each frame of the DRC group based on the initial DRC gain value. In one embodiment, the selected coding mode represented by the first data value is chosen from a predefined set of coding modes. In one embodiment, the DRC gain values are applied using interpolation. In one embodiment, the interpolation is a linear interpolation in the linear domain. In one embodiment, multiple channels are assigned to a single DRC group. In one embodiment, a non-uniform time resolution is used for update rates of DRC gain values based on the variance of gain generated by encoder DRC to minimize the bit rate of the bitstream. In one embodiment, the first data value representing the initial gain value is encoded using a non-uniform quantization scale based on psychoacoustics to minimize the bit rate of the bitstream. In one embodiment, the first data value representing the initial gain value is encoded using a variable-length code to minimize the bit rate of the bitstream. In one embodiment, the third data value representing differences applied to the initial DRC gain value for each frame of the DRC group is encoded to minimize the bit rate of the bitstream. In one embodiment, the third data value representing differences applied to the initial DRC gain value are encoded variable-length codes to minimize the bit rate of the bitstream.

As explained above, an embodiment of the invention may be a machine-readable medium such as one or more solid state memory devices having stored thereon instructions which program one or more data processing components (generically referred to here as "a processor" or a "computer system") to perform some of the operations described above. In other embodiments, some of these operations might be performed by specific hardware components that contain hardwired logic. Those operations might alternatively be performed by any combination of programmed data processing components and fixed hardwired circuit components.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. A method for applying Dynamic Range Control (DRC) gain values to a piece of sound program content, comprising:
    gathering, by an electronic audio playback device, multi-band DRC configuration information, wherein the multi-band DRC configuration information indicates the number of independent DRC gain sequences in a bitstream and the number of DRC channel groups in the bitstream for an entire audio band or for multiple sub-bands;
    parsing the bitstream to retrieve quantized data values representing DRC gain values for each DRC gain frame;
    decoding the quantized data values using code tables to generate DRC gain data that has undergone encoding to reduce bit rate of the bitstream;
    decoding the DRC gain data to undo said encoding, so as to generate DRC gain values to be applied to corresponding audio frames of the piece of sound program content, wherein decoding the DRC gain data comprises
        extracting one or more time delta values from the bitstream, wherein the time delta values indicate time separation between pairs of DRC gain values, and
        extracting one or more gain delta values from the bitstream, wherein the gain delta values indicate DRC gain value differences between pairs of DRC gain values; and
    applying the DRC gain values to the entire audio band or multiple sub-bands of each audio frame.

2. The method of claim 1, wherein the DRC configuration information is gathered from a header of the bitstream.

3. The method of claim 1, further comprising:
    extracting a coding mode data value from the bitstream for each DRC gain frame in each DRC channel group, wherein the coding mode data value represents an encoding mode of the DRC gain values in each corresponding DRC gain frame.

4. The method of claim 3, further comprising:
    extracting an initial gain value from the bitstream for each DRC gain frame, wherein the initial gain value is used to apply gain to a first segment of a corresponding audio frame.

5. The method of claim 1, further comprising:
    extracting an initial gain value from the bitstream for each DRC gain frame, wherein the initial gain value is used to apply gain to a first segment of a corresponding audio frame, and wherein decoding the DRC gain data comprises
        generating a DRC gain value for the first segment of an audio frame based on the initial gain value for a corresponding DRC gain frame; and
        generating DRC gain values for a second segment of the audio frame using interpolation based on the DRC gain value generated for the first segment, time delta values, and gain delta values associated with the first and second segments.

6. The method of claim 5, wherein the interpolation is a linear interpolation or a window-based overlap-add interpolation.

7. The method of claim 1 wherein decoding the DRC gain data comprises:
extracting slope values from the bitstream for each DRC gain frame, wherein the slope values correspond to sampled points of a DRC gain curve representing the DRC gain values.

8. The method of claim 7 wherein decoding the DRC gain data comprises:
generating a DRC gain value for the first segment of an audio frame based on the initial gain value for a corresponding DRC gain frame; and
generating DRC gain values for a second segment of the audio frame using interpolation based on the DRC gain value generated for the first segment, a slope value, time delta values, and gain delta values associated with the first and second segments.

9. The method of claim 8, wherein the interpolation is a spline interpolation.

10. The method of claim 1, further comprising:
filtering the audio signal to split each audio frame into multiple sub-bands.

11. An article of manufacture comprising:
a non-transitory machine-readable medium having stored therein instructions which program a processor to gather multi-band dynamic range control (DRC) configuration information that indicates the number of independent DRC gain sequences in a bitstream and the number of DRC channel groups in the bitstream, wherein the bitstream contains a piece of sound program content, wherein the multi-band DRC configuration information refers to either an entire audio band or to multiple sub-bands,
the programmed processor to parse the bitstream to retrieve quantized data values that represent DRC gain values for each DRC gain frame, decode the quantized data values using code tables to generate DRC gain data that has undergone encoding to reduce bit rate of the bitstream, decode the DRC gain data to undo said encoding, so as to generate DRC gain values by extracting one or more time delta values from the bitstream, wherein each of the time delta values indicates a time separation between a pair of DRC gain values, and by extracting one or more gain delta values from the bitstream, wherein each of the gain delta values indicates a gain value difference between a pair of DRC gain values, and apply the DRC gain values to corresponding audio frames of the piece of sound program content, wherein the DRC gain values are applied to the entire audio band or to multiple sub-bands of each audio frame.

12. The article of manufacture of claim 11, wherein the machine-readable medium has instructions that program the processor to gather the DRC configuration information from a header of the bitstream.

13. The article of manufacture of claim 11 wherein the machine-readable medium contains further stored instructions that program the processor to extract a coding mode data value from the bitstream, for each DRC gain frame in each DRC channel group, wherein the coding mode data value represents an encoding mode of the DRC gain values in each corresponding DRC gain frame.

14. The article of manufacture of claim 13 wherein the machine-readable medium contains further instructions stored therein that program the processor to extract an initial gain value from the bitstream for each DRC gain frame, and apply gain to a first segment of a corresponding audio frame using the extracted initial gain value.

15. The article of manufacture of claim 14 wherein the machine-readable medium contains further instructions that program the processor to generate a DRC gain value for the first segment of an audio frame, based on the initial gain value for a corresponding DRC gain frame, and
generate DRC gain values for a second segment of the audio frame using interpolation based on the DRC gain value generated for the first segment, time delta values, and gain delta values associated with the first and second segments.

16. The article of manufacture of claim 14 wherein the machine-readable medium has stored therein further instructions that program the processor to extract slope values from the bitstream, for each DRC gain frame, wherein the slope values correspond to sampled points of a DRC gain curve representing the DRC gain values.

17. The article of manufacture of claim 16 wherein the machine-readable medium has stored therein further instructions that program the processor to generate a DRC gain value for the first segment of an audio frame based on the initial gain value for a corresponding DRC gain frame, and generate DRC gain values for a second segment of the audio frame using interpolation based on the DRC gain value generated for the first segment, a slope value, time delta values, and gain delta values associated with the first and second segments.

18. The article of manufacture of claim 17 wherein the instructions stored in the machine-readable medium program the processor to perform a linear interpolation when generating the DRC gain values for the second segment of the audio frame.

19. An article of manufacture comprising:
a non-transitory machine-readable medium having stored therein instructions which program a processor to gather multi-band dynamic range control (DRC) configuration information that indicates the number of independent DRC gain sequences in a bitstream and the number of DRC channel groups in the bitstream, wherein the bitstream contains a piece of sound program content, wherein the multi-band DRC configuration information refers to either an entire audio band or to multiple sub-bands,
the programmed processor to parse the bitstream to retrieve quantized data values that represent DRC gain values for each DRC gain frame, decode the quantized data values using code tables to generate DRC gain data,
decode the DRC gain data by i) extracting one or more time delta values from the bitstream, wherein each of the time delta values indicates a time separation between pairs of DRC gain values, and ii) extracting one or more gain delta values from the bitstream, wherein the gain delta values indicate DRC gain value differences between pairs of DRC gain values, to generate DRC gain values, and
apply the DRC gain values to corresponding audio frames of the piece of sound program content, wherein the DRC gain values are applied to the entire audio band or to multiple sub-bands of each audio frame.

20. The article of manufacture of claim 19 wherein the machine-readable medium contains further stored instructions that program the processor to extract a coding mode data value from the bitstream, for each DRC gain frame in each DRC channel group, wherein the coding mode data value represents an encoding mode of the DRC gain values in each corresponding DRC gain frame.

21. The article of manufacture of claim 19 wherein the machine-readable medium contains further instructions stored therein that program the processor to extract an initial gain value from the bitstream for each DRC gain frame, and apply gain to a first segment of a corresponding audio frame using the extracted initial gain value.

22. The article of manufacture of claim 21 wherein the machine-readable medium has stored therein instructions that program the processor to extract one or more time delta values from the bitstream, wherein each of the time delta values indicates a time separation between pairs of DRC gain values, and extract one or more gain delta values from the bitstream, wherein the gain delta values indicate DRC gain value differences between pairs of DRC gain values.

23. The article of manufacture of claim 22 wherein the machine-readable medium contains further instructions that program the processor to generate a DRC gain value for the first segment of an audio frame, based on the initial gain value for a corresponding DRC gain frame, and
generate DRC gain values for a second segment of the audio frame using interpolation based on the DRC gain value generated for the first segment, time delta values, and gain delta values associated with the first and second segments.

24. The article of manufacture of claim 19 wherein the machine-readable medium has stored therein further instructions that program the processor to extract slope values from the bitstream, for each DRC gain frame, wherein the slope values correspond to sampled points of a DRC gain curve representing the DRC gain values.

25. The article of manufacture of claim 24 wherein the machine-readable medium has stored therein further instructions that program the processor to generate a DRC gain value for the first segment of an audio frame based on the initial gain value for a corresponding DRC gain frame, and generate DRC gain values for a second segment of the audio frame using interpolation based on the DRC gain value generated for the first segment, a slope value, time delta values, and gain delta values associated with the first and second segments.

26. The article of manufacture of claim 25 wherein the instructions stored in the machine-readable medium program the processor to perform a linear interpolation when generating the DRC gain values for the second segment of the audio frame.

* * * * *